US011600965B2

(12) United States Patent
Zhang et al.

(10) Patent No.: US 11,600,965 B2
(45) Date of Patent: Mar. 7, 2023

(54) BURST MODE LASER DRIVING CIRCUIT

(71) Applicant: Google LLC, Mountain View, CA (US)

(72) Inventors: Tao Zhang, Mountain View, CA (US); Cedric Fung Lam, San Carlos, CA (US); Shuang Yin, Sunnyvale, CA (US); Xiangjun Zhao, Fremont, CA (US); Liang Du, Santa Clara, CA (US); Changhong Joy Jiang, Dublin, CA (US); Adam Edwin Taylor Barratt, Portland, OR (US); Claudio Desanti, Ountain View, CA (US); Muthu Nagarajan, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 165 days.

(21) Appl. No.: 17/057,651

(22) PCT Filed: May 6, 2019

(86) PCT No.: PCT/US2019/030853
§ 371 (c)(1),
(2) Date: Nov. 21, 2020

(87) PCT Pub. No.: WO2019/226306
PCT Pub. Date: Nov. 28, 2019

(65) Prior Publication Data
US 2021/0203129 A1 Jul. 1, 2021

Related U.S. Application Data

(60) Provisional application No. 62/674,392, filed on May 21, 2018.

(51) Int. Cl.
H01S 5/042 (2006.01)
H01S 5/026 (2006.01)
(Continued)

(52) U.S. Cl.
CPC .......... *H01S 5/0428* (2013.01); *H01S 5/0265* (2013.01); *H01S 5/0427* (2013.01);
(Continued)

(58) Field of Classification Search
CPC ........................... H01S 5/06253; H01S 5/428
See application file for complete search history.

(56) References Cited

U.S. PATENT DOCUMENTS 4,539,686 A * 9/1985 Bosch ................. H01S 5/06213
372/38.02
5,014,280 A * 5/1991 Sanada ................. H01S 5/0625
372/50.1

(Continued)

OTHER PUBLICATIONS

Kawanaka Takanori et al: "Experimental Investigation into Burst-Mode Wavelength Drift of a Mass-Produced 10 Gbit/s EML for TWDM- PON", 2017 European Conference on Optical Communication (ECOC), IEEE, Sep. 17, 2017 (Sep. 17, 2017), pp. 1-3, XP033336505, DOI: 10.1109/ECOC.2017.8346179 [retrieved on Apr. 24, 2018].

(Continued)

*Primary Examiner* — Tod T Van Roy
(74) *Attorney, Agent, or Firm* — Honigman LLP; Brett A. Krueger

(57) ABSTRACT

A method (900) includes a gain current ($I_{GAIN}$) to an anode of a gain-section diode ($D_0$) disposed on a shared substrate of a tunable laser (310), delivering a modulation signal to an anode of an Electro-absorption section diode ($D_2$) disposed on the shared substrate of the tunable laser, and receiving a burst mode signal (330) indicative of a burst-on state or a burst-off state. When the burst mode signal is indicative of the burst-off state, the method includes sinking a sink current ($I_{SINK}$) away from the gain current at the anode of the gain-section diode. When the burst mode signal transitions to be indicative of the burst-on state from the burst-off state, (Continued)

the method includes ceasing the sinking of the sink current away from the gain current and delivering an overshoot current ($I_{OVER}$) to the anode of the gain-section diode.

28 Claims, 12 Drawing Sheets

(51) Int. Cl.
*H01S 5/0625* (2006.01)
*H01S 5/068* (2006.01)
*H01S 5/323* (2006.01)
*H04B 10/50* (2013.01)
*H04B 10/27* (2013.01)
*H04B 10/564* (2013.01)

(52) U.S. Cl.
CPC ............ *H01S 5/068* (2013.01); *H01S 5/0625* (2013.01); *H01S 5/06253* (2013.01); *H01S 5/32391* (2013.01); *H04B 10/504* (2013.01); *H01S 5/06256* (2013.01); *H04B 10/27* (2013.01); *H04B 10/564* (2013.01)

(56) References Cited

U.S. PATENT DOCUMENTS

| | | | | |
|---|---|---|---|---|
| 5,088,097 A * | 2/1992 | Ono | ................ | H01S 3/1055 372/20 |
| 5,513,197 A * | 4/1996 | Koishi | ................ | H01S 5/042 372/38.07 |
| 5,706,117 A * | 1/1998 | Imai | ................ | G02F 1/0123 372/29.02 |
| 6,044,097 A * | 3/2000 | Kawamura | ........... | H01S 5/0427 372/38.01 |
| 7,031,358 B2 * | 4/2006 | Nakayama | ............. | H01S 5/042 372/38.1 |
| 8,121,161 B2 * | 2/2012 | Tanaka | ................ | H01S 5/06213 372/38.07 |
| 8,705,979 B2 * | 4/2014 | Fujita | .................. | H01S 5/0428 398/189 |
| 8,737,442 B2 * | 5/2014 | Moto | ................... | H01S 5/0428 372/38.07 |
| 9,088,122 B2 * | 7/2015 | Moto | ................... | H01S 5/0085 |
| 9,667,031 B2 * | 5/2017 | Ritter | ................. | H05B 45/375 |
| 9,912,116 B2 * | 3/2018 | Asaka | ................ | H04B 10/503 |
| 10,103,513 B1 * | 10/2018 | Zhang | ................. | H01S 5/068 |
| 10,153,612 B1 * | 12/2018 | Zhang | ................. | H01S 5/125 |
| 10,454,243 B2 * | 10/2019 | Bai | .................... | H01S 5/06808 |
| 10,461,498 B2 * | 10/2019 | Zhang | ................. | H01S 5/06256 |
| 10,587,092 B2 * | 3/2020 | Ono | ...................... | H01S 5/0428 |
| 10,666,013 B2 * | 5/2020 | Tanaka | ................. | H01S 5/0427 |
| 10,680,406 B2 * | 6/2020 | Ono | ...................... | H01S 5/1017 |
| 11,329,450 B2 * | 5/2022 | Nakamura | ........... | H01S 5/34326 |
| 11,329,451 B2 * | 5/2022 | Pannwitz | .............. | G01S 17/931 |
| 2002/0006141 A1 * | 1/2002 | Ogura | ................. | H01S 5/06255 372/18 |
| 2002/0064353 A1 * | 5/2002 | Yokoyama | ........... | G02B 6/4215 385/88 |
| 2002/0075919 A1 * | 6/2002 | Tochio | ................. | H01S 5/042 372/38.02 |
| 2003/0057456 A1 * | 3/2003 | Wada | ................. | H01S 5/04256 257/222 |
| 2003/0174744 A1 * | 9/2003 | Reilly | ................. | H01S 5/0683 372/32 |
| 2003/0185257 A1 * | 10/2003 | Suzuki | .................... | H01S 5/042 372/50.1 |
| 2004/0109482 A1 * | 6/2004 | Nakayama | .............. | H01S 5/042 372/38.02 |
| 2007/0127534 A1 * | 6/2007 | Shimamura | ........... | H01S 5/0265 372/46.015 |
| 2013/0016745 A1 * | 1/2013 | Moto | ..................... | H01S 5/0428 372/29.011 |
| 2014/0341593 A1 * | 11/2014 | van Veen | ............. | H04B 10/272 398/201 |
| 2016/0013614 A1 * | 1/2016 | Moto | ..................... | H01S 5/0427 372/38.02 |
| 2016/0141833 A1 * | 5/2016 | Moto | ..................... | H01S 5/0428 372/38.02 |
| 2017/0222726 A1 * | 8/2017 | Kubo | ................... | H04B 10/504 |
| 2017/0237232 A1 * | 8/2017 | Asaka | ............. | H04B 10/25137 372/38.02 |
| 2019/0036302 A1 * | 1/2019 | Zhang | .................... | H01S 5/0428 |
| 2019/0173262 A1 * | 6/2019 | Ono | ...................... | H01S 5/0206 |
| 2019/0181608 A1 * | 6/2019 | Ono | ...................... | H01S 5/0265 |
| 2020/0076159 A1 * | 3/2020 | Choi | .................... | H01S 5/06255 |
| 2020/0321748 A1 * | 10/2020 | Pannwitz | .............. | G01S 17/931 |
| 2021/0151952 A1 * | 5/2021 | Zhang | ................. | H01S 5/06255 |
| 2021/0167577 A1 * | 6/2021 | Zhang | ................. | H01S 5/02415 |
| 2021/0184426 A1 * | 6/2021 | Koyama | ............... | H01S 5/0427 |
| 2021/0203129 A1 * | 7/2021 | Zhang | ................. | H01S 5/0428 |
| 2021/0203130 A1 * | 7/2021 | Zhang | ................. | H01S 5/0625 |

OTHER PUBLICATIONS

International Search Report and Written Opinion for the related Application No. PCT/US2019/030853, dated Aug. 2, 2019.

* cited by examiner

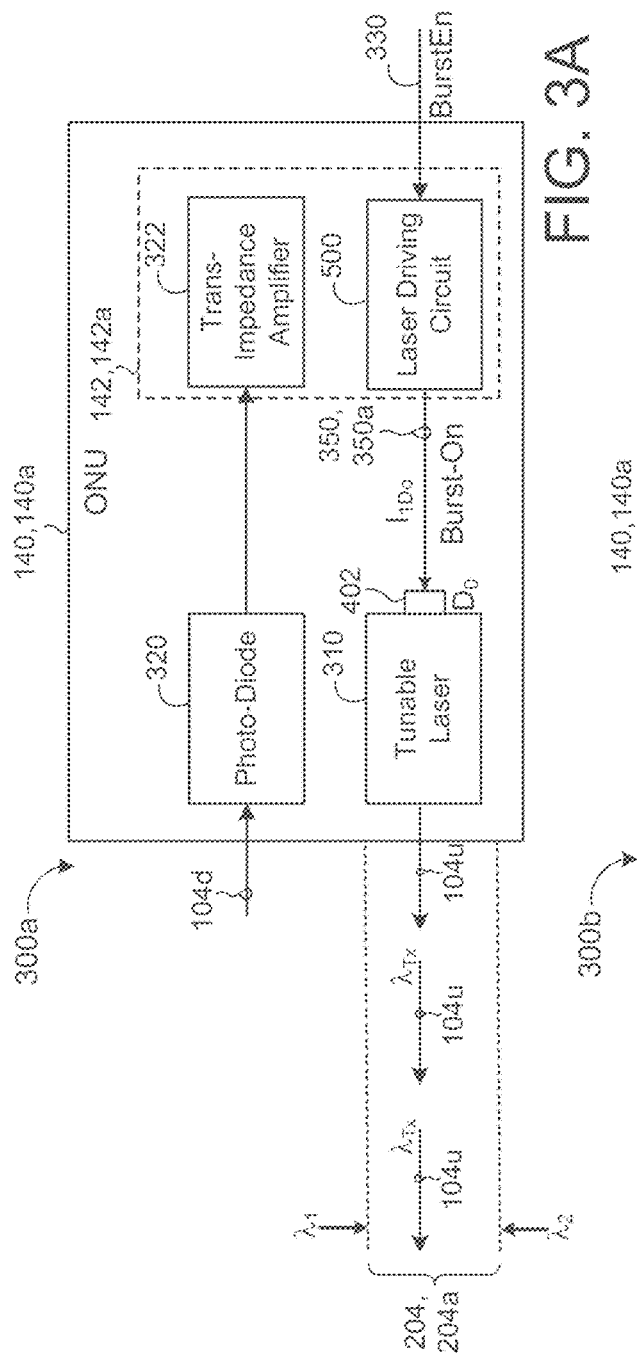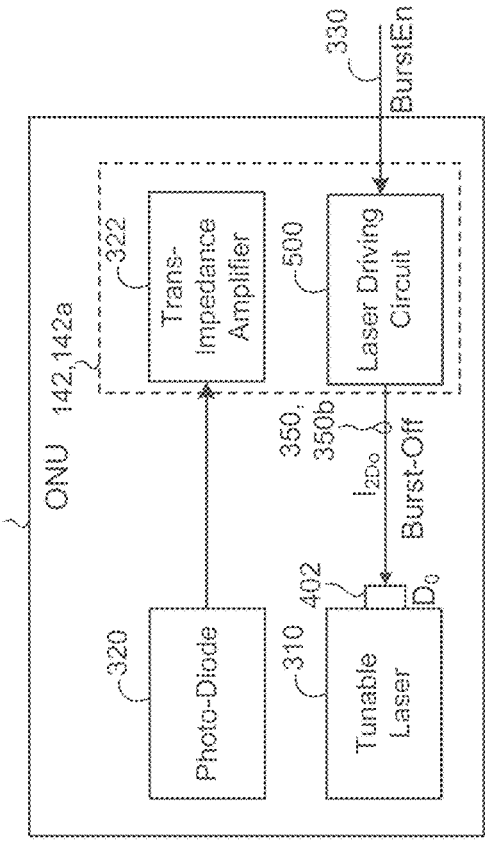

BURST MODE LASER DRIVING CIRCUIT

TECHNICAL FIELD

This disclosure relates to burst mode laser driving circuits.

BACKGROUND

Fiber optic communication is an emerging method of transmitting information from a source (transmitter) to a destination (receiver) using optical fibers as the communication channel. A Wavelength-Division Multiplexing Passive Optical Network (WDM-PON) is an optical technology for access and backhaul networks. WDM-PON uses multiple different wavelengths over a physical point-to-multipoint fiber infrastructure that contains passive optical components. The use of different wavelengths allows for traffic separation within the same physical fiber. The result is a network that provides logical point-to-point connections over a physical point-to-multipoint network topology. WDM-PON allows operators to deliver high bandwidth to multiple endpoints over long distances. A PON generally includes an optical line terminal located at a service provider central office (e.g., a hub), a remote node connected to the central office by a feeder fiber, and a number of optical network units or optical network terminals, near end users. The remote node demultiplexes an optical signal from the central office and distributes the demultiplexed optical signals to multiple optical network terminals along corresponding distribution fibers. Time-division-multiplexing (TDM) is a method of transmitting and receiving independent signals over a common signal path by using different, non-overlapping time slots. Time wavelength division multiplexing (TWDM) uses both time and wavelength dimensions to multiplex signals. Color-less optical network units (ONUs), which are based on tunable laser and suitable driving topologies, are critical components for flexible WDM/TWDM-PON system architectures. The laser driving circuit in the ONU is the component to generate the upstream optical signal. To meet the WDM/TWDM-PON system requirements, the driving circuit has to guarantee the optical output has not only enough power and modulation magnitudes, but also short burst switching times and minimum wavelength drifts.

SUMMARY

One aspect of the disclosure provides a method for biasing and modulating a tunable laser during burst-on and burst-off states through a laser driving circuit. The method includes delivering, by the laser driving circuit, a gain current to an anode of a gain-section diode disposed on a shared substrate of a tunable laser, and delivering, by the laser driving circuit, a modulation signal to an anode of an Electro-absorption (EA) section diode disposed on the shared substrate of the tunable laser. The method also includes receiving, at the laser driving circuit, a burst mode signal indicative of a burst-on state or a burst-off state. When the burst mode signal is indicative of the burst-off state, the method includes sinking, by the laser driving circuit, a sink current away from the gain current at the anode of the gain-section diode. The sink current is less than the gain current delivered to the anode of the gain-section diode. When the burst mode signal transitions to be indicative of the burst-on state from the burst-off state, the method includes: ceasing, by the laser driving circuit, the sinking of the sink current away from the gain current at the anode of the gain-section diode; and delivering, by the laser driving circuit, an overshoot current to the anode of the gain-section diode.

Implementations of the disclosure may include one or more of the following optional features. In some implementations, when the burst mode signal is indicative of the burst-off state, the gain-section diode includes a gain section diode current equal to the gain current minus the sink current. Here the gain-section diode current is greater than zero and less than an operating current for the tunable laser, wherein the operating current corresponds to a current threshold to transition between the burst-on state and the burst-off state. The laser driving circuit may include a high-speed transmission line between the gain-section diode and a current sink source and/or a high-speed transmission line between the EA section diose and a current modulation source. In some examples, the EA section diode is reversely biased by a programmable voltage source. The modulation signal associated with the EA section diode may be separate from the burst mode signal associated with the gain section diode In some examples, the method also includes receiving, at the laser driving circuit, a sink current adjustment from a burst stage of the laser driving circuit, wherein the sink current adjustment is configured to adjust the sink current. The burst stage may include a differential pair of first and second MOSFETs, each MOSFET connected to a burst mode signal source, the first MOSFET connected to a resistor, the resistor connected to a voltage source, the second MOSFET connected to the anode of the gain-section diode. When the burst mode signal is indicative of the burst-off state, the first MOSFET may be turned off and the second MOSFET may be turned on to sink the sink current away from the anode of the gain-section diode. On the other hand, when the burst mode signal is indicative of the burst-on state, the first MOSFET may be turned on and the second MOSFET may be turned off to cease the sinking of the sink current away from the anode of the gain-section diode.

In some implementations, the method also includes delivering, by the laser driving circuit, the overshoot current to the anode of the gain-section diode for a transition period of time after commencement of the burst-on state. Here, the transition period of time is less than a burst-on period of time corresponding to a duration of the burst-on state. The laser driving circuit may include an overshoot stage capacitively coupled to the anode of the gain-section diode to deliver the overshoot current to the anode of the gain-section diode. Here, the overshoot stage includes a common-source amplifier that includes an n-type metal-oxide-semiconductor field-effect transistor (MOSFET) connected to a burst mode signal source and a first resistor.

In some examples, delivering the modulation signal further includes capacitively-coupling a modulation stage of the laser driving circuit to the anode of the EA section diode. In these examples, the modulation stage includes a differential pair of first and second metal-oxide-semiconductor field-effect transistors (MOSFETs), whereby each MOSFET is connected to a data signal source and the first MOSFET connected to a first resistor. Here, the first resistor is connected to a voltage source while the second MOSFET connected by a capacitor to the anode of the EA section diode. Additionally, the second MOSFET may be connected to a second resistor connected to a variable voltage source. The tunable laser may include a multi-section tunable laser.

Another aspect of the disclosure provides a laser driving circuit that includes a voltage source configured to deliver a gain current to an anode of a gain-section diode disposed on a shared substrate of a tunable laser, and a modulation stage configured to deliver a modulation signal to an anode of an Electro-absorption (EA) section diode disposed on the shared substrate of the tunable laser. The laser driving circuit also includes a burst stage configured to receive a burst mode signal indicative of a burst-on state or a burst-off state. When the burst mode signal is indicative of the burst-off state, the bust stage is configured to sink a sink current away from the gain current at the anode of the gain-section diode. The sink current is less than the gain current delivered to the anode of the gain-section diode. When the burst mode signal transitions to be indicative of the burst-on state from the burst-off state, the burst stage is configured to cease the sinking of the sink current away from the gain current at the anode of the gain-section diode. The laser driving circuit also includes an overshoot stage configured to deliver an overshoot current to the anode of the gain-section diode.

This aspect may include one or more of the following optional features. In some implementations, when the burst mode signal is indicative of the burst-off state, the gain-section diode includes a gain section diode current equal to the gain current minus the sink current. Here the gain-section diode current is greater than zero and less than an operating current for the tunable laser, wherein the operating current corresponds to a current threshold to transition between the burst-on state and the burst-off state. The laser driving circuit may include a high-speed transmission line between the gain-section diode and a current sink source and/or a high-speed transmission line between the EA section diose and a current modulation source. In some examples, the EA section diode is reversely biased by a programmable voltage source. The modulation signal associated with the EA section diode may be separate from the burst mode signal associated with the gain section diode.

In some examples, the burst stage is further configured to provide a sink current adjustment, wherein the sink current adjustment is configured to adjust the sink current. The burst stage may include a differential pair of first and second MOSFETs, each MOSFET connected to a burst mode signal source, the first MOSFET connected to a resistor, the resistor connected to a voltage source, the second MOSFET connected to the anode of the gain-section diode. When the burst mode signal is indicative of the burst-off state, the first MOSFET may be turned off and the second MOSFET may be turned on to sink the sink current away from the anode of the gain-section diode. On the other hand, when the burst mode signal is indicative of the burst-on state, the first MOSFET may be turned on and the second MOSFET may be turned off to cease the sinking of the sink current away from the anode of the gain-section diode.

In some implementations, the overshoot stage delivers the overshoot current to the anode of the gain-section diode for a transition period of time after commencement of the burst-on state. Here, the transition period of time is less than a burst-on period of time corresponding to a duration of the burst-on state. The overshoot stage may be capacitively coupled to the anode of the gain-section diode to deliver the overshoot current to the anode of the gain-section diode. Here, the overshoot stage includes a common-source amplifier that includes an n-type metal-oxide-semiconductor field-effect transistor (MOSFET) connected to a burst mode signal source and a first resistor.

In some examples, the modulation stage is capacitively coupled to the anode of the EA section diode. In these examples, the modulation stage includes a differential pair of first and second metal-oxide-semiconductor field-effect transistors (MOSFETs), whereby each MOSFET is connected to a data signal source and the first MOSFET connected to a first resistor. Here, the first resistor is connected to a voltage source while the second MOSFET connected by a capacitor to the anode of the EA section diode. Additionally, the second MOSFET may be connected to a second resistor connected to a variable voltage source. The tunable laser may include a multi-section tunable laser.

The details of one or more implementations of the disclosure are set forth in the accompanying drawings and the description below. Other aspects, features, and advantages will be apparent from the description and drawings, and from the claims.

DESCRIPTION OF DRAWINGS

FIGS. 3A and 3B are schematic views of an optical network unit configured to suppress wavelength drift when switching between operation in a burst-on state and a burst-off state.

Like reference symbols in the various drawings indicate like elements.

DETAILED DESCRIPTION

Figure 1:
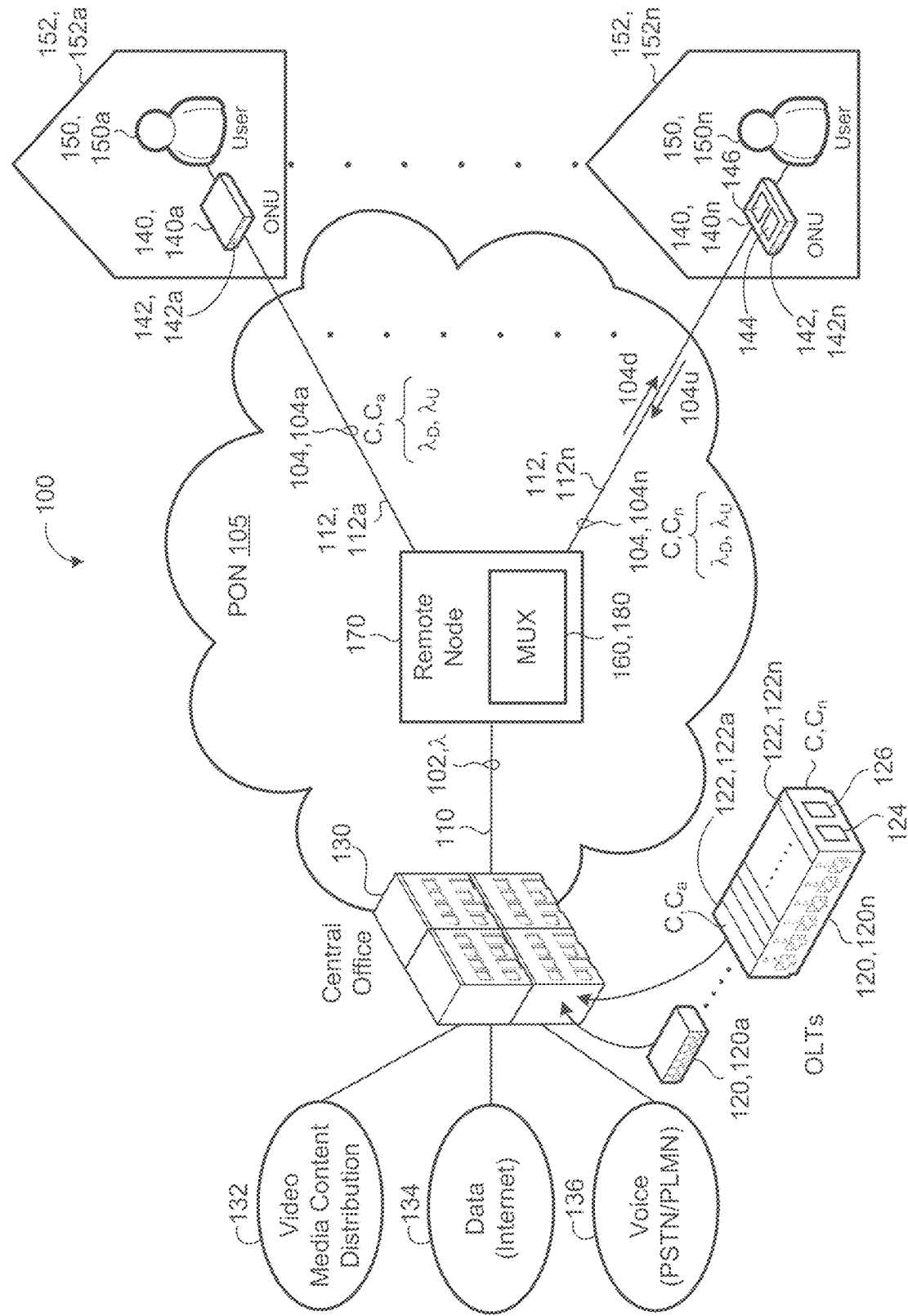
FIG. 1 is a schematic view of an example communication system.

Referring to FIG. 1, an optical communication system 100 delivers communication signals 102 (e.g., optical signals) through communication links 110, 112, 112a-n (e.g., optical fibers or line-of-sight free space optical communications) between an optical line terminal (OLT) 120 housed in a central office (CO) 130 and optical network units (ONUs) 140, 140a-n (e.g., a bidirectional optical transceiver) associated with users 150, 150a-n (also referred to as customers or subscribers). The ONUs 140, 140a-n are typically located at premises 152, 152a-n of the users 150, 150a-n.

Customer premises equipment (CPE) is any terminal and associated equipment located at the premises 152 of the user 150 and connected to a carrier telecommunication channel C at a demarcation point ("demarc"). In the examples shown, the ONU 140 is a CPE. The demarc is a point established in a house, building, or complex to separate customer equipment from service provider equipment. CPE generally refers to devices such as telephones, routers, switches, residential gateways (RG), set-top boxes, fixed mobile convergence products, home networking adapters, or Internet access gateways that enable the user 150 to access services of a communications service provider and distribute them around the premises 152 of the user 150 via a local area network (LAN).

In some implementations, the optical communication system 100 implements an optical access network 105, such as a passive optical network (PON) 105, for example, for access and mobile fronthaul/backhaul networks. In some examples, the optical communication system 100 implements a point-to-point (pt-2-pt) PON having direct connections, such as optical Ethernets, where a home-run optical link 110, 112 (e.g., fiber) extends all the way back to an OLT 120 at the CO 130 and each customer 150, 150a-n is terminated by a separate OLT 120a-n. In other examples, the optical communication system 100 implements a point-to-multi-point (pt-2-multi-pt) PON, where a shared OLT 120 services multiple customers 150, 150a-n.

The CO 130 includes at least one OLT 120 connecting the optical access network 105 to an Internet Protocol (IP), Asynchronous Transfer Mode (ATM), or Synchronous Optical Networking (SONET) backbone, for example. Therefore, each OLT 120 is an endpoint of the PON 105 and converts between electrical signals used by service provider equipment and optical signals 102 used by the PON 105. Each OLT 120, 120a-n includes at least one transceiver 122, 122a-n, depending on the implementation of the optical access network 105. The OLT 120 sends the optical signal 102 via a corresponding transceiver 122, through a feeder fiber 110 to a remote node (RN) 170, which includes a band-multiplexer 160 configured to demultiplex the optical signal 102 and distribute demultiplexed optical signals 104 to multiple users 150, 150a-n along corresponding distribution fibers 112, 112a-n. The band-multiplexer 160 for multiplexing/demultiplexing may be an arrayed waveguide grating 180 (AWG), which is a passive optical device. In some examples, each CO 130 includes multiple OLTs 120, 120a-n, and each OLT 120 is configured to service a group of users 150. In addition, each OLT 120 may be configured to provide signals in different services, e.g., one OLT 120 may provide services in 1G-PON, while another OLT 120 provides services in 10G-PON.

As shown in FIG. 1, the CO 130 multiplexes signals received from several sources, such as a video media distribution source 132, an Internet data source 134, and a voice data source 136, and multiplexes the received signals into one multiplexed signal 102 before sending the multiplexed optical signal 102 to the RN 170 through the feeder fiber 110. The multiplexing may be performed by the OLT 120 or a broadband network gateway (BNG) positioned at the CO 130. Typically, services are time-division-multiplexed on the packet layer.

Time-division-multiplexing (TDM) is a method of transmitting and receiving independent signals over a common signal path by using different, non-overlapping time slots. Wavelength division multiplexing (WDM) uses multiple wavelengths λ to implement point-to-multi-point communications in the PON 105. The OLT 120 serves multiple wavelengths through one fiber 110 to the band-multiplexer 160 at the RN 170, which multiplexes/demultiplexes signals between the OLT 120 and a plurality of ONUs 140, 140a-n. Multiplexing combines several input signals and outputs a combined signal. Time wavelength division multiplexing (TWDM) uses both time and wavelength dimensions to multiplex signals.

For WDM and dense-WDM (DWDM), the OLT 120 includes multiple optical transceivers 122, 122a-n. Each optical transceiver 122 transmits signals at one fixed wavelength $\lambda_D$ (referred to as a downstream wavelength) and receives optical signals 102 at one fixed wavelength $\lambda_U$ (referred to as an upstream wavelength). The downstream and upstream wavelengths $\lambda_D$, $\lambda_U$ may be the same or different. Moreover, a channel C may define a pair of downstream and upstream wavelengths $\lambda_D$, $\lambda_U$, and each optical transceiver 122, 122-n of a corresponding OLT 120 may be assigned a unique channel $C_{a-n}$.

The OLT 120 multiplexes/demultiplexes the channels C, $C_{a-n}$ of its optical transceivers 122, 122a-n for communication of an optical signal 102 through the feeder fiber 110. Whereas, the band-multiplexer 160 at the RN 170 multiplexes/demultiplexes optical signals 102, 104, 104-n between the OLT 120 and a plurality of ONUs 140, 140a-n. For example, for downstream communications, the band-multiplexer 160 demultiplexes the optical signal 102 from the OLT 120 into ONU optical signals 104, 104a-n, i.e., downstream optical signals 104d, for each corresponding ONU 140, 140a-n. For upstream communications, the band-multiplexer 160 multiplexes ONU optical signals 104, 104a-n from each corresponding ONU 140, 140a-n, i.e., upstream optical signals 104u, into the optical signal 102 for delivery to the OLT 120. To make the transmission successful, the optical transceivers 122, 122a-n of the OLT 120 match with the ONUs 140, 140a-n one-by-one. In other words, the downstream and upstream wavelengths $\lambda_D$, $\lambda_U$ (i.e., the channel C) of respective downstream and upstream optical signals 104d, 104u to and from a given ONU 140 matches the downstream and upstream wavelengths $\lambda_D$, $\lambda_U$ (i.e., the channel C) of a corresponding optical transceiver 122.

In some implementations, each ONU 140, 140a-n includes a corresponding tunable ONU transceiver 142, 142a-n (e.g., that includes a laser or light emitting diode) that can tune to any wavelength λ used by a corresponding OLT 120 at a receiving end. The ONU 140 may automatically tune the tunable ONU transceiver 142 to a wavelength λ that establishes a communication link between the corresponding OLT 120 and the ONU 140. Each optical transceiver 122, 142 may include data processing hardware 124, 144 (e.g., control hardware, circuitry, field programmable gate arrays (FPGAs, etc.) and memory hardware 126, 146 in communication with the data processing hardware 124, 144. The memory hardware 126, 146 may store instructions (e.g., via firmware) that when executed on the data processing hardware 124, 144 cause the data processing hardware 124, 144 to perform operations for auto-tuning the optical transceiver 122, 142. In some configurations, the tunable ONU transceiver 142 includes a laser driving circuit 500 (FIG. 5) configured to continuously provide a current to a tunable laser 310 in a burst-on state (FIG. 3A) and a burst-off state (FIG. 3B). The ONU 140 may include a photodetector that converts the optical wave to an electrical form. The electrical signal may be further de-multiplexed down to subcomponents (e.g., data over a network, sound waves converted into currents using microphones and back to its original physical form using speakers, converting images converted into currents using video cameras and converting back to its physical form using a television).

Figure 2:
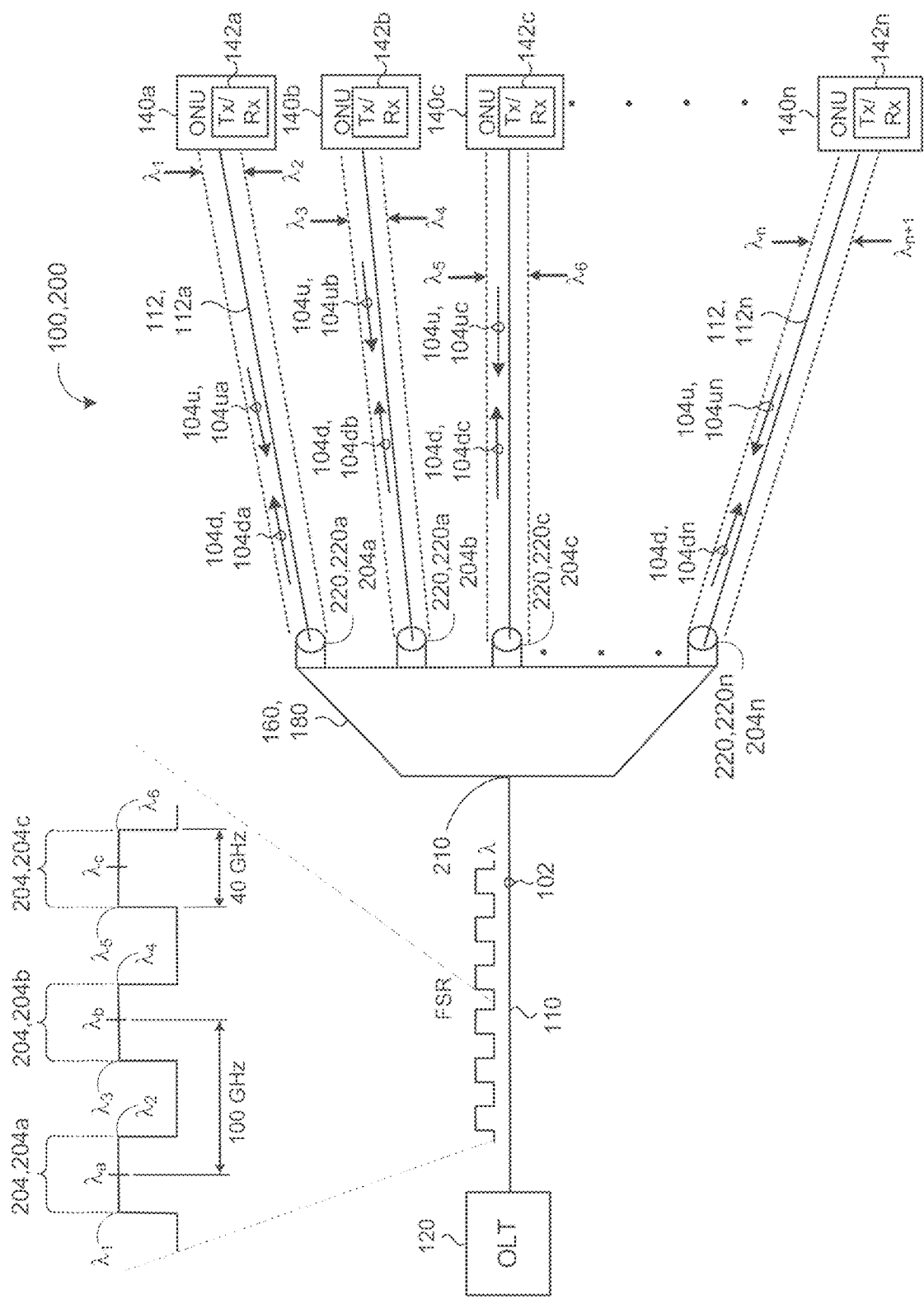
FIG. 2 is a schematic view of an example dense-wavelength division multiplexing architecture for a communication system.

FIG. 2 illustrates an example DWDM architecture 200 for the communication system 100 that facilitates user aggregation onto a single strand of fiber 110, 112, 112a-n. An exemplary arrayed waveguide grating 180 (AWG), which may be used as a band-multiplexer 160, is optically coupled to the OLT 120 and a plurality of ONUs 140, 140a-n. The AWG 180 may be used to demultiplex an optical signal 102 through the feeder fiber 110 from the OLT 120 into downstream ONU optical signals 104d, 104da-104dn of several different wavelengths λ for each corresponding ONU 140, 140a-n. The AWG 180 may reciprocally multiplex upstream ONU optical signals 104u, 104ua-104un of different wavelengths λ from each ONU 140 into a single optical feeder fiber 110, whereby the OLT 120 receives the multiplexed optical signal 104 through the feeder fiber 110. The AWG 180 includes a multiplex port 210 optically coupled to the OLT 120 and a plurality of demultiplex ports 220, 220a-n. Each demultiplex port 220 is optically coupled to a corresponding ONU 140 of the plurality of ONUs 140, 140a-n. In some examples, the AWG 180 is disposed at the RN 170. In other examples, the AWG 180 is disposed OLT 120, or more specifically, co-located with the OLT 120 at the CO 130.

The AWG 180 is cyclic in nature. The wavelength multiplexing and demultiplexing property of the AWG 180 repeats over periods of wavelengths called free spectral range (FSR). Multiple wavelengths, separated by the FSR, are passed through the AWG 180 from each demultiplex port 220 to the multiplex port 210. In the example shown, each of the multiple wavelengths λ of the FSR is separated by about 100 Gigahertz (GHz) with a wavelength pass-band 204 of about 40 GHz. For instance, first, second, and third wavelengths $\lambda_a$, $\lambda_b$, $\lambda_c$ are each separated by 100 GHz and associated with a corresponding wavelength pass-band 204, 204a-c of about 40 GHz. However, in other configurations, the wavelength pass-band 204 may be greater than or equal to 40 GHz. The wavelength pass-band 204a associated with wavelength $\lambda_a$ is defined by lower and upper wavelength limits $\lambda_1$, $\lambda_2$, the wavelength pass-band 204b associated with wavelength $\lambda_b$ is defined by upper and lower wavelength limits $\lambda_3$, $\lambda_4$, and the wavelength pass-band 204c associated with wavelength $\lambda_c$ is defined by upper and lower wavelength limits $\lambda_5$, $\lambda_6$. The wavelength pass-bands 204 may be separated by a range of wavelengths associated with a stop-band. In the example shown, a stop-band is defined between the upper wavelength limit $\lambda_2$ of the wavelength pass-band 204a and the lower wavelength limit $\lambda_3$ of the wavelength pass-band 204b, and another stop-band is defined between the upper wavelength limit $\lambda_4$ of the wavelength pass-band 204b and the lower wavelength limit $\lambda_5$ of the wavelength pass-band 204c.

In some implementations, each demultiplex port 220, 220a-n of the AWG 180 is associated with a corresponding one of the wavelength pass-bands 204, 204a-n. Here, the AWG 180 is configured to allow passage therethrough of each upstream optical signal 104u having a wavelength within the wavelength pass-band 204 associated with the corresponding demultiplex port 220. However, for any upstream optical signals 104u having a wavelength outside the wavelength pass-band 204 associated with the corresponding demultiplex port 220, the AWG 180 is configured to block the passage therethrough of those upstream optical signals 104u. In the example shown, the ONU transceiver 142a of the ONU 140a transmits a corresponding optical signal 104ua at a wavelength within the wavelength pass-band 204a of the corresponding demultiplex port 220a. For instance, the wavelength of the optical signal 104ua is greater than the lower wavelength limit $\lambda_1$ and less than the upper wavelength limit of the wavelength pass-band 204a. Similarly, each ONU transceiver 142b-n of the ONUs 140b-n transmits a corresponding optical signal 104ub-104un at a corresponding wavelength within the wavelength pass-band 204b-n associated with the corresponding demultiplex port 220b-n.

Generally, to avoid crosstalk at the OLT 120, only one ONU 140 transmits upstream optical signals 104u to the OLT 120 at a time. The ONU transceivers 142 include a transmitter 310 (FIGS. 3A and 3B), usually a semiconductor laser, configured to transmit upstream optical signals 104u to the OLT 120 in a burst-on state. Turning off the laser 310 to cease transmission of the optical signals 104u to the OLT 120 when not in use causes the temperature of the laser 310 to cool. The laser 310 is once again heated when turned on to transmit a subsequent upstream optical signal 104u. The thermal fluctuation caused by the repeated heating and cooling results in wavelength drift each time the laser is turned on. In some examples, the wavelength of the optical signals 104u drift out of the wavelength pass-band 204 associated with the band-multiplexer 160, 180, thereby resulting in the band-multiplexer 160, 180 blocking the passage there through of the optical signals 104u to the OLT 120.

Referring to FIGS 3A and 3B, in some implementations, the ONU transceiver 142, 142a of the ONU 140, 140a of the communication system 100 includes a laser driving circuit 500 for a tunable laser 310 configured to suppress wavelength drift when switching between operation in a burst-on state (FIG. 3A) and a burst-off state (FIG. 3B). Referring to FIG. 3A, the schematic view 300a shows the ONU 140 tuning the tunable laser 310 while in the burst-on state to transmit the optical signal 104u at the transmit wavelength $\lambda_{Tx}$ within the wavelength pass-band 204, 204a of the band-multiplexer 160 (e.g., AWG 180). The band-multiplexer 160 is configured to allow passage of the optical signal 104u at the transmit wavelength $\lambda_{Tx}$.

The band-multiplexer 160 may include the AWG 180 having the corresponding demultiplex port 220, 220a associated with the wavelength pass-band 204, 204a defined by the upper and lower wavelength limits $\lambda_1$, $\lambda_2$. The ONU transceiver 142 also includes a trans-impedance amplifier (TIA) 322 configured to receive downstream optical signals 104d through a photo-diode 320 from the OLT 120 that have been demultiplexed by the band-multiplexer 160. The data processing hardware (e.g., control hardware) 144, 144a of the ONU 140 implements a laser driving circuit 500 with alternating current (AC) coupling that electrically couples electrical signals to the tunable laser 310 to enable fast switching between the burst-on and burst-off states and minimize wavelength drifts. For instance, the laser driving circuit 500 may deliver a burst-on current 350, 350a to the tunable laser 310 to operate the laser 310 in the burst-on state and may deliver a burst-off current 350, 350b to the tunable laser 310 to operate the tunable laser 310 in the burst-off state.

In some examples, the laser driving circuit 500 receives a burst mode signal (BurstEn) 330 indicative of the burst-on state to deliver the burst-on current 350a to the tunable laser 310 (i.e., deliver a first diode current $I_{D_0}$ to the anode of the gain-section diode $D_0$). The burst-on current 350a may bias the tunable laser 310 to transmit the optical signal 104u at the transmit wavelength $\lambda_{Tx}$ within the wavelength pass-band 204 of the band-multiplexer 160.

Referring to FIG. 3B, the schematic view 300b shows the ONU 140a tuning the tunable laser 310 in the burst-off state to cease transmission of the optical signal 104u to the OLT 120. While in the burst-off state, the laser 310 is not lasing or is only producing an optical power output of low magnitude insufficient for receipt by the receiver sensitivity at the OLT 120. In some implementations, the laser driving circuit 500 receives the burst mode signal (BurstEn) 330 indicative of the burst-off state to deliver the burst-off current 350b to the tunable laser 310 (i.e., delivers second diode current $I_{2D_0}$ to the anode of the gain-section diode $D_0$). The burst-off current 350b is less than the burst-on current 350a and may bias the tunable laser 310 to cease transmission of the optical signal 104u at the transmit wavelength $\lambda_{Tx}$ within the wavelength pass-band 204.

In some examples, during the burst-off state, the laser driving circuit 500 delivers the burst-off current 350b to the tunable laser 310 (e.g., to the anode of the gain-section diode $D_0$) to keep the laser warm during the burst-off state. Here, the burst-off current 350b corresponds to a difference between the gain current ($I_{GAIN}$) and a sink current ($I_{SINK}$) sinking a portion of the $I_{GAIN}$ away from the anode of the gain-section diode $D_0$. In some implementations, the laser 310 is continuously heated by the reduced burst-off current 350b (i.e., difference between $I_{GAIN}$ and $I_{SINK}$) during the burst-off state. Thus, rather than un-powering the laser 310 entirely by sinking all the gain current ($I_{GAIN}$) or grounding the anode of the gain-section diode $D_0$ to cease transmission of the optical signal 104u to the OLT 120, and thereby cause cooling of the laser 310, the gain-section diode $D_0$ is configured to receive the burst-off current 350b to heat the tunable laser 310, while at the same time ceasing transmission of the optical signal 104u to the OLT 120. The continuous heating of the tunable laser 310 by the burst-off current 350b while in the burst-off state may decrease thermal fluctuations at the laser 310, and thereby inhibit wavelength drifts from occurring when the ONU 140 operates to subsequently transmit data in the optical signal 104u for receipt by the OLT 120.

Figure 4A:
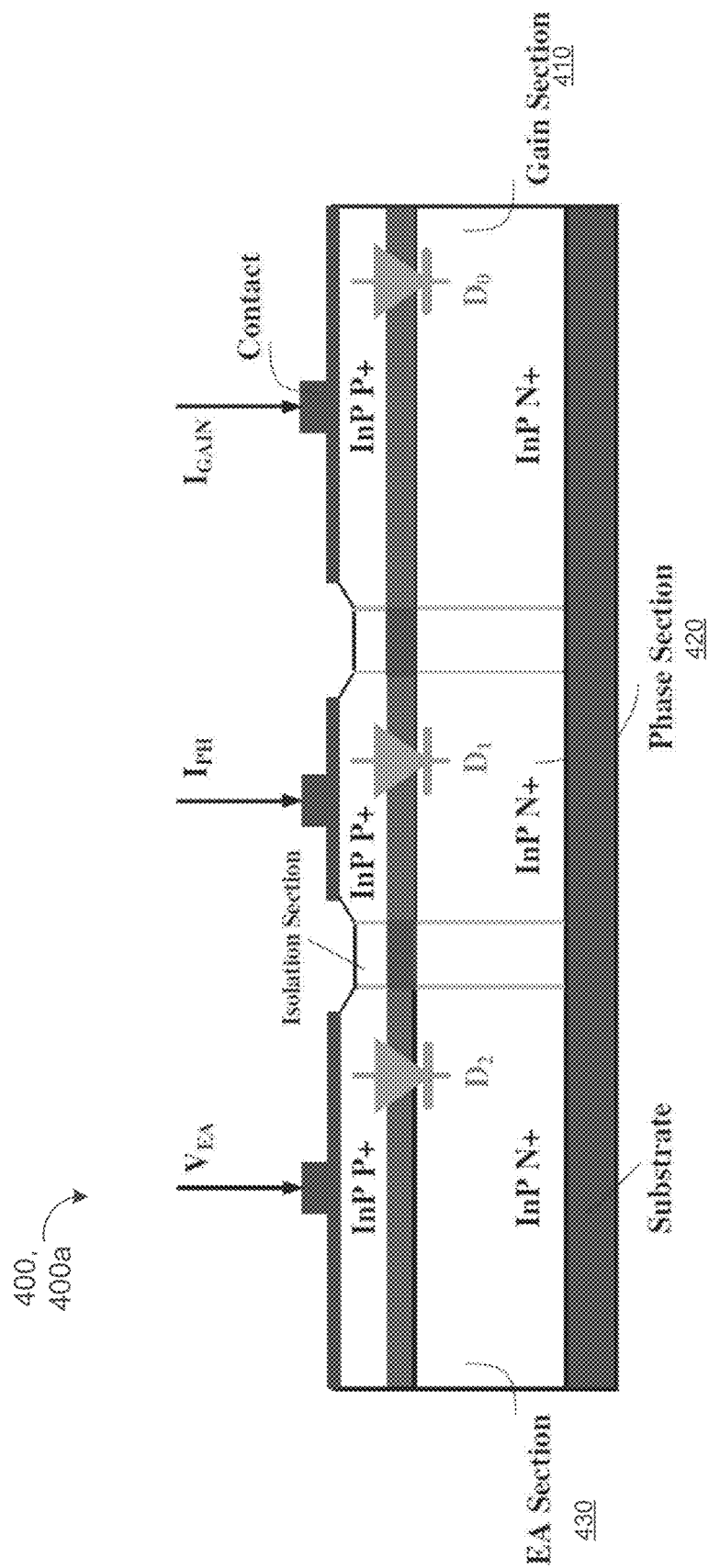
FIGS. 4A-4C are schematic views of example multi-section tunable lasers.
Figure 4B:
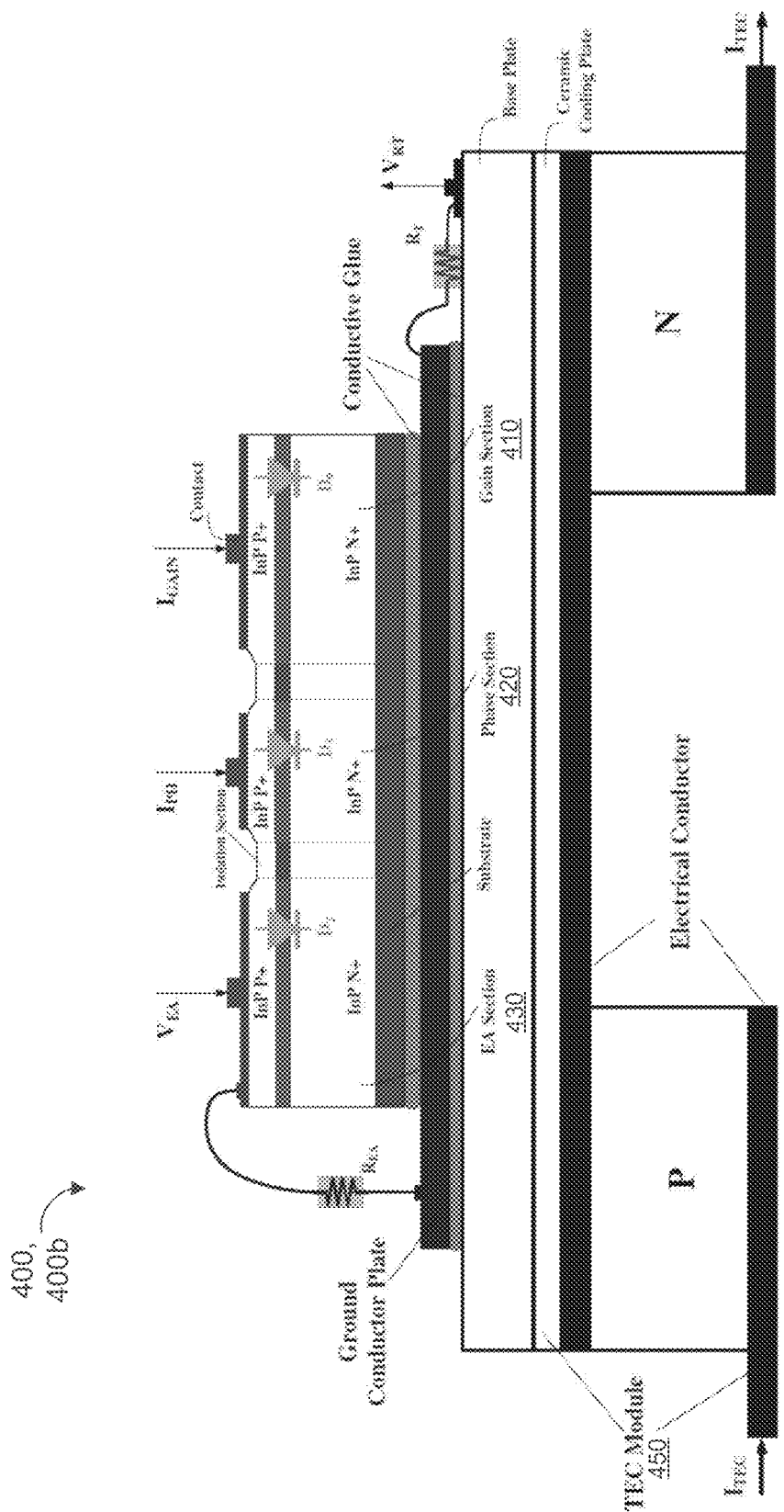
Figure 4C:
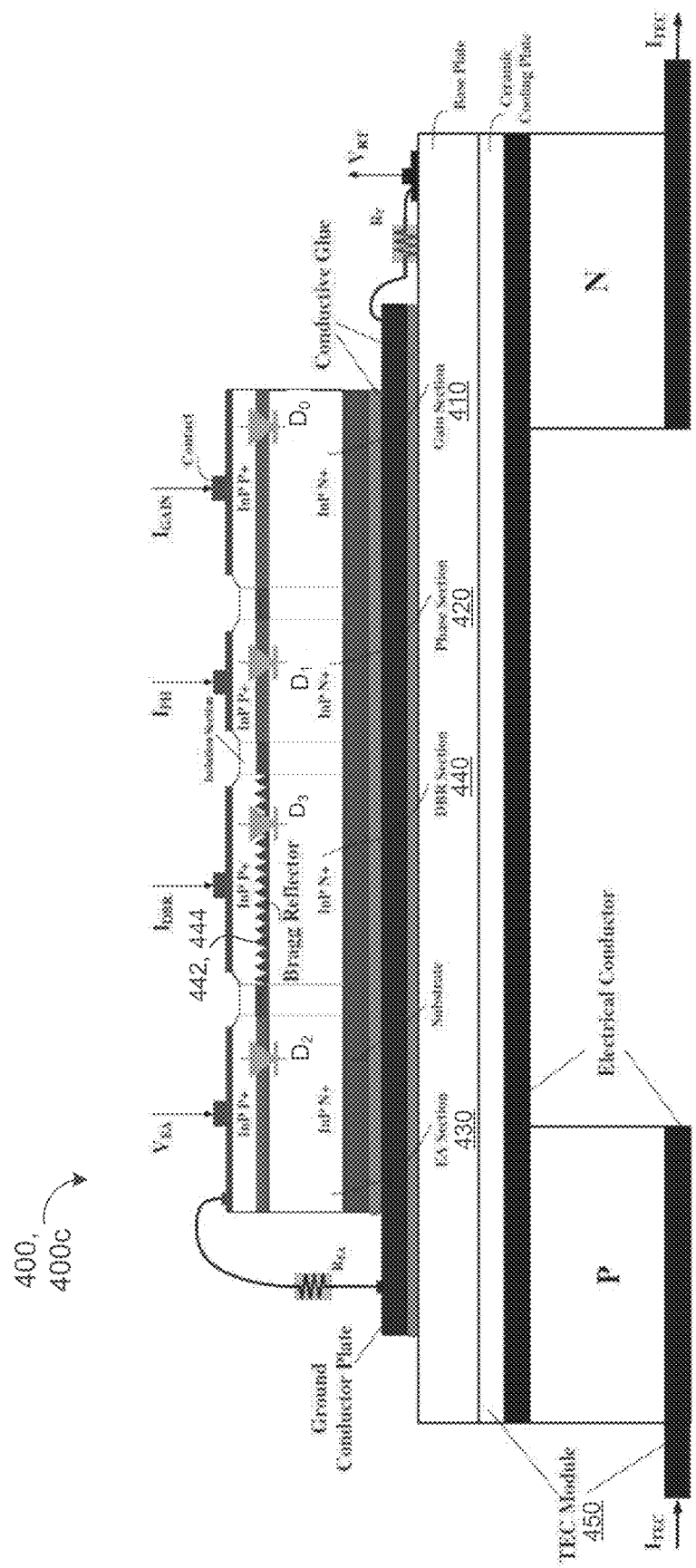

FIGS. 4A-4C depict examples of the tunable laser 310 as Electro-absorption Modulated Lasers (EML) 400, 400a-c. In some configurations, the tunable laser 310 includes a multi-section structure with each section/structure sharing a single substrate. As an example, the sections may include a gain section 410, a phase section 420, an Electro-absorption (EA) section 430, a distributed Bragg reflector (DBR) section 440, and a Thermoelectric Cooling section/module (TEC) 450. Each section has a P-doped Indium phosphide (InP) region on a shared N-doped InP substrate which forms a corresponding diode ($D_0$, $D_1$, $D_2$, $D_3$) with a common cathode. These diodes may be driven by corresponding injection currents ($I_{GAIN}$, $I_{PHASE}$, $I_{DBR}$) or voltage ($V_{EA}$).

The gain section 410 may provide the function of generating a suitable optical power for achieving the transmission distance of the optical signal 104u to the OLT 120. The tunable laser 310 and/or circuitry (e.g., the driving circuit 500) communicating with the tunable laser 310 may provide these gain section functions through implementation of the driving current $I_{GAIN}$ in the example shown. The driving current generates output power to the carrier wavelength $\lambda$.

The phase section 420 may provide adjustable phase shifts for fine-tuning the wavelength $\lambda$ through a phase injection current ($I_{PHASE}$). The EA section 430 may receive an input voltage $V_{EA}$ to function as an optical switch when the modulation voltage is introduced. As the amplitude of voltage or current changes at the anode of the EA section 430, the output power intensity of the tunable laser changes, therefore, the modulation information is added. The DBR section 440 (FIG. 4C) is configured to perform as a wavelength tuning mechanism for the tunable laser 310 by changing a refractive index 442 of a DBR 444 within the DBR section 440. Additionally or alternatively, the TEC section 450 may include a ceramic cooling plate and a P-doped and N-doped region between conductors associated with an injection current $I_{TEC}$ to aid in cooling the tunable laser 310. The tunable laser 310 is not limited to DBR lasers or TEC lasers and may correspond to any multi-section tunable laser 310.

FIG. 4A provides an example EML 400, 400a for use in burst mode operations in TWDM-PON applications. The laser 400, 400a may include a multi-section structure having a gain section 410, a phase section 420, and an Electro-Absorption (EA) section 430. The Continuous-Wavelength (CW) light emits from the gain-section 410 using the current $I_{GAIN}$. The EA section 430 is reversely-biased by a negative voltage source $V_{EA}$ and works as an optical switch with the modulation voltage. The phase section 420 suppresses the crosstalk between the gain and EA sections 410, 430. The phase section 420 may also fine-tune the wavelength $\lambda$ by using the current $I_{PHASE}$.

FIG. 4B provides an example EML 400, 400b, similar to the EML 400, 400a, but with a TEC section 450. The TEC module 450 precisely controls the temperature of the laser 400, 400b by cooling or warming the laser 400, 400b. Because of the correlation between temperature and wavelength $\lambda$, this precise temperature control helps to tune the wavelength $\lambda$. A thermistor $R_T$, which behaves as a temperature sensor, may attach to the base plate of the EML chip via an adhesive (e.g., conductive glue). The sensed voltage $V_{RT}$, which indicates the EML chip temperature, feeds the control electronics to tune the TEC current $I_{TEC}$, until the EML chip temperature reaches the target temperature. Therefore, the target temperature helps hone the wavelength $\lambda$. The termination resistor $R_{EA}$ may be bonded to the EA section 430 for impedance matching purposes during high-speed modulation. In FIG. 4C, the EML 400, 400c is similar to the EML 400, 400b, but additionally includes a DBR section 440 as a wavelength tuning mechanism. The DBR section 440 may further extend a tuning range of the tunable laser 310 (e.g., the EML 400, 400c) by changing the refractive index 442 of the DBR 444 with the injection current $I_{DBR}$.

Figure 5:
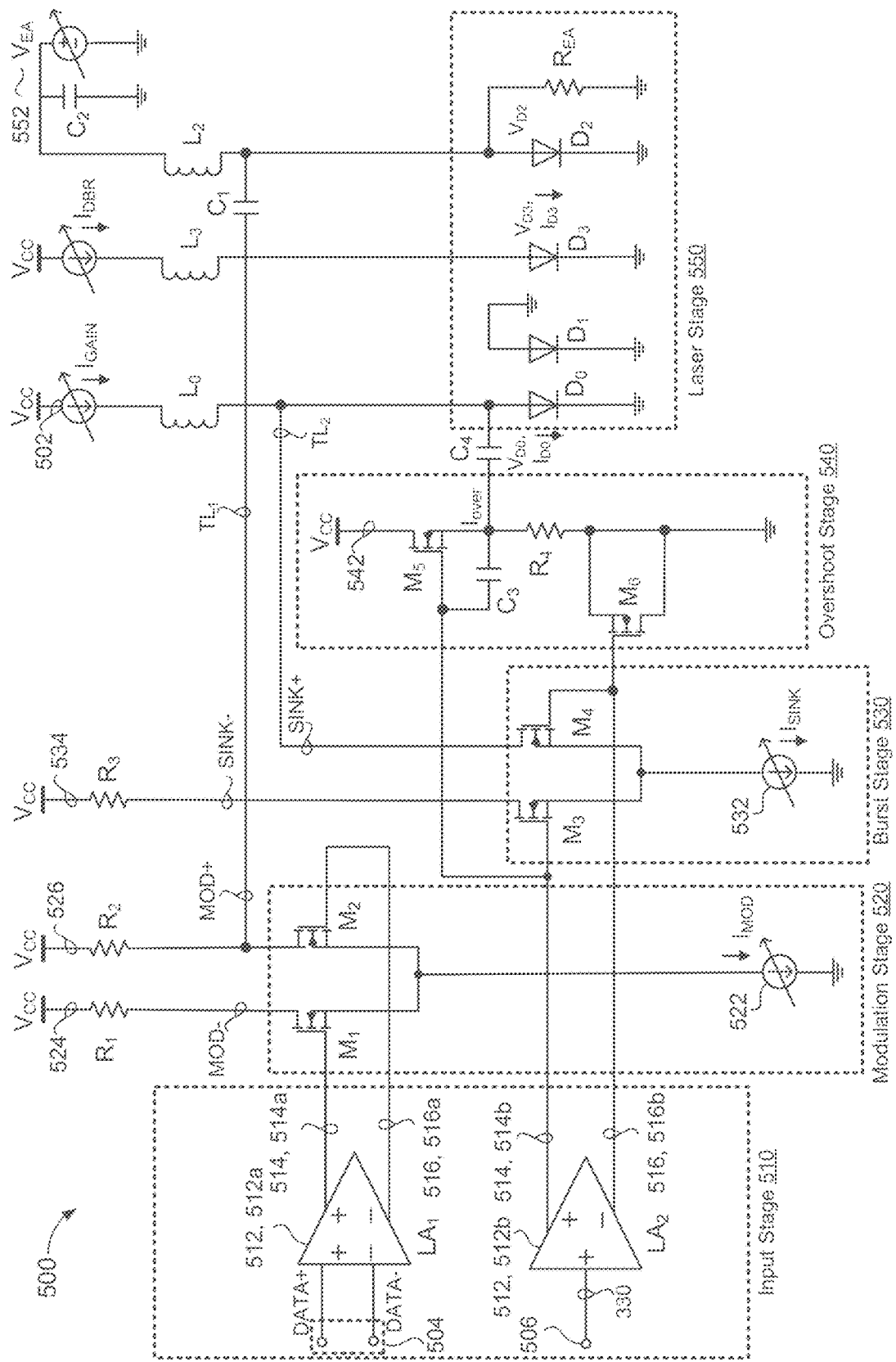
FIG. 5 is a schematic view of an example laser driving circuit for use in a tunable optical network unit (ONU).

FIG. 5 provides a schematic view of the laser driving circuit 500 for use in a tunable ONU 140. In some examples, an EML (e.g., EMLs 400, 400a-c) includes the driving circuit 500 for burst mode applications. The driving circuit 500 is configured to deliver and/or modify the gain section diode current $I_{D0}$ at the anode of the gain-section diode $D_0$ disposed on the shared substrate of the multi-section tunable laser 310 based on the burst mode (e.g., burst-off state or burst-on state) of the tunable laser 310. A cathode-side of the gain-section diode $D_0$ is grounded while the anode-side of the gain-section diode $D_0$ is connected to a voltage source $V_{CC}$ 502 that delivers the gain current $I_{GAIN}$ to the anode of the gain-section diode $D_0$. Here, the magnitude of the gain current $I_{GAIN}$ delivered to the diode $D_0$ determines the optical power of the laser 310 for transmitting optical signals 104u at the at the transmit wavelength $\lambda_{Tx}$ within the wavelength pass-band 204 in the burst-on state. The driving circuit 500 includes an input stage 510, a modulation stage 520, a burst stage 530, an overshoot stage 540, and a laser stage 550. The laser stage 550 is connected to the sections 410-450 of the tunable laser 310. For example, FIG. 5 depicts the stages 510-540 connected to the gain section 410 and the EA section 430. The circuit 500 may further deliver an injection current $I_{DBR}$ to the anode of the DBR section diode $D_3$ to drive the DBR section 440. The injection current $I_{DBR}$ may be implemented by a current direct-to-analog convener (DAC). Referring to FIG. 5, the input stage 510 includes a pair of amplifiers 512, 512a-b (e.g., a pair of limiting amplifiers $LA_1$, $LA_2$). In some examples, the pair of amplifiers 512, 512a-b are configured such that the amplified output signals are large enough to completely switch tail current sources (i.e. the modulation current $I_{MOD}$ and the sink current $I_{SINK}$). The first amplifier ($LA_1$) 512, 512a receives input data signals DAT+, DAT− providing data information from a data signal source 504 and amplifies the input data signals DAT+, DAT− into amplified output signals 514a, 516a. In the example shown, the $LA_1$ 512a corresponds to a differential-in differential-out limiting amplifier for amplifying the differential input data signals DAT+, DAT− from the data signal source 504. The second amplifier ($LA_2$) 512, 512b receives the burst mode signal (BurstEN) 330 indicative of the burst-on state (FIG. 3A) or the burst-off state (FIG. 3B) from a burst mode signal source 506 and amplifies the BurstEN 330 into amplified output signals 514b, 516b. For example, a logic high or '1' may indicate a burst-on state while a logic low or '0' may indicate a burst-off state. In the example shown, the second amplifier 512, 512b corresponds to a single-ended-in differential-out limiting amplifier for amplifying the BurstEN 330 from the burst mode signal source 506. Additionally or alternatively, for speed and signal considerations, inputs of the amplifiers 512, 512a-b may include termination resistors to avoid signal reflection. Here, in FIG. 5, the first amplifier 512, 512a sends the amplified output signals 514a, 516a to the modulation stage 520 and the second amplifier 512, 512b sends the amplified output signals 514b, 516b to the burst stage 530.

The modulation stage 520 is configured to deliver a modulation signal to an anode of the EA section diode $D_2$ disposed on the shared substrate of the tunable laser 310. Referring further to FIG. 5, the modulation stage 520 includes a differential pair of transistors $M_1$, $M_2$, a modulation tail current source 522, and resistors $R_1$, $R_2$. The modulation tail current source 522 is programmable and may be implemented by a current direct-to-analog converter (DAC) to control a modulation magnitude of the modulation current $I_{MOD}$. In some implementations, the transistors $M_1$, $M_2$ are n-type metal-oxide-semiconductors (NMOS) field-effect transistors (MOSFETs) such that with a high signal these transistors activate (turn ON) to permit current to flow across the transistors. In other implementations, the transistors $M_1$, $M_2$ may be bipolar junction transistors (BJTs). In some examples, the EA diode $D_2$, in the EML Laser stage 550, is reversely-biased by a programmable voltage source $V_{EA}$ 552. In these examples, to avoid affecting a normal operating point with the reverse-biasing voltage, an AC capacitor $C_1$ couples modulation from the modulation stage 520 to an anode of the EA section diode $D_2$. Additionally or alternatively, a second capacitor $C_2$ filters low-frequency ripples from the programmable voltage source $V_{EA}$ 552. In some configurations, such as FIG. 5, to increase speed and signal integrity, a second resistor $R_2$, optimally located near voltage supply $V_{CC}$ 526, is matched (e.g., has the same value) with resistor $R_{EA}$. In some implementations, a connection (e.g., shown as MOD+) between the modulation stage 520 and the EA section 430 of the laser stage 550 includes a high-speed transmission line (e.g., transmission line $TL_1$). For example, the connection to the first capacitor $C_1$ functions as a high-speed transmission line $TL_1$ with characteristic impedance equal to $R_{EA}$. Here, between the programmable voltage source $V_{EA}$ 552 and the first capacitor $C_1$ or the EA section diode $D_2$, an inductor $L_2$ shields the EA section diode $D_2$ during high-speed modulation from the negative voltage source $V_{EA}$ 552 effects.

The burst stage 530 is configured to impact the gain section 410 of the tunable laser 310 based on the burst mode signal (BurstEN) 330. In some implementations, such as FIG. 5, the burst stage 530 is separate from the modulation stage 520. For example, the burst stage 530 connects to the second amplifier 512, 512b that delivers the amplified burst mode signal 514b, 516b, but does not connect to the first amplifier 512, 512a. With continued reference to FIG. 5, the burst stage 530 includes a differential pair of transistors $M_3$, $M_4$ and a sink tail current source 532. In some implementations, the third and fourth transistors $M_3$, $M_4$ are n-type metal-oxide-semiconductors (NMOS) field-effect transistors (MOSFETs) such that with a high signal these transistors activate to permit current to flow across the transistors. In other implementations, the transistors $M_3$, $M_4$ may be bipolar junction transistors (BJTs). The sink tail current source 522 is programmable and provides a sink current (sink adjustment that may be implemented by a current direct-to-analog converter (DAC) to control a magnitude of the sink current $I_{SINK}$.

When the burst mode signal 330 indicates a burst-on state (e.g., where the amplified BurstEN signal is high) the third transistor $M_3$ activates (turns ON) while the fourth transistor $M_4$ is inactive (OFF) (e.g., due to the complimentary amplified output signal of the burst mode signal being low). Here, the sink tail current source 532 causes all current to flow from the voltage source $V_{CC}$ 534 through the third resistor $R_3$ and across the third transistor $M_3$ to ground without impacting the gain current $I_{GAIN}$ at the anode of the gain section diode $D_0$. Accordingly, when the burst mode signal 330 indicates the burst-on state, the tunable laser 310 is driven by the gain current $I_{GAIN}$ without further biasing from the burst stage 530 (e.g., the sink current $I_{SINK}$). Thus, in scenarios when the burst mode signal 330 transitions from being indicative of the burst-off state to be indicative of the burst-on state, the driving circuit 500 is configured to cease any sinking of the sink current $I_{SINK}$ from the gain current $I_{GAIN}$ at the anode of the gain-section diode $D_0$.

When the burst mode signal 330 indicates a burst-off state (e.g., where the amplified BurstEN signal is low) the third transistor $M_3$ is inactivate (OFF) while the fourth transistor $M_4$ activates (ON) (e.g., due to the complimentary amplified output signal of the burst mode signal being high). Here, the sink tail current source 532 within the burst stage 530 sinks current from the gain current $I_{GAIN}$ based on the sink current $I_{SINK}$. For example, the gain section diode current $I_{DO}$ equals the gain current $I_{GAIN}$ minus the sink current $I_{SINK}$. Additionally or alternatively, during high burst speeds, the burst stage 530 may be connected to the gain section diode $D_0$ via a high speed transmission line (shown as $TL_2$) for signal integration considerations.

Figure 6:
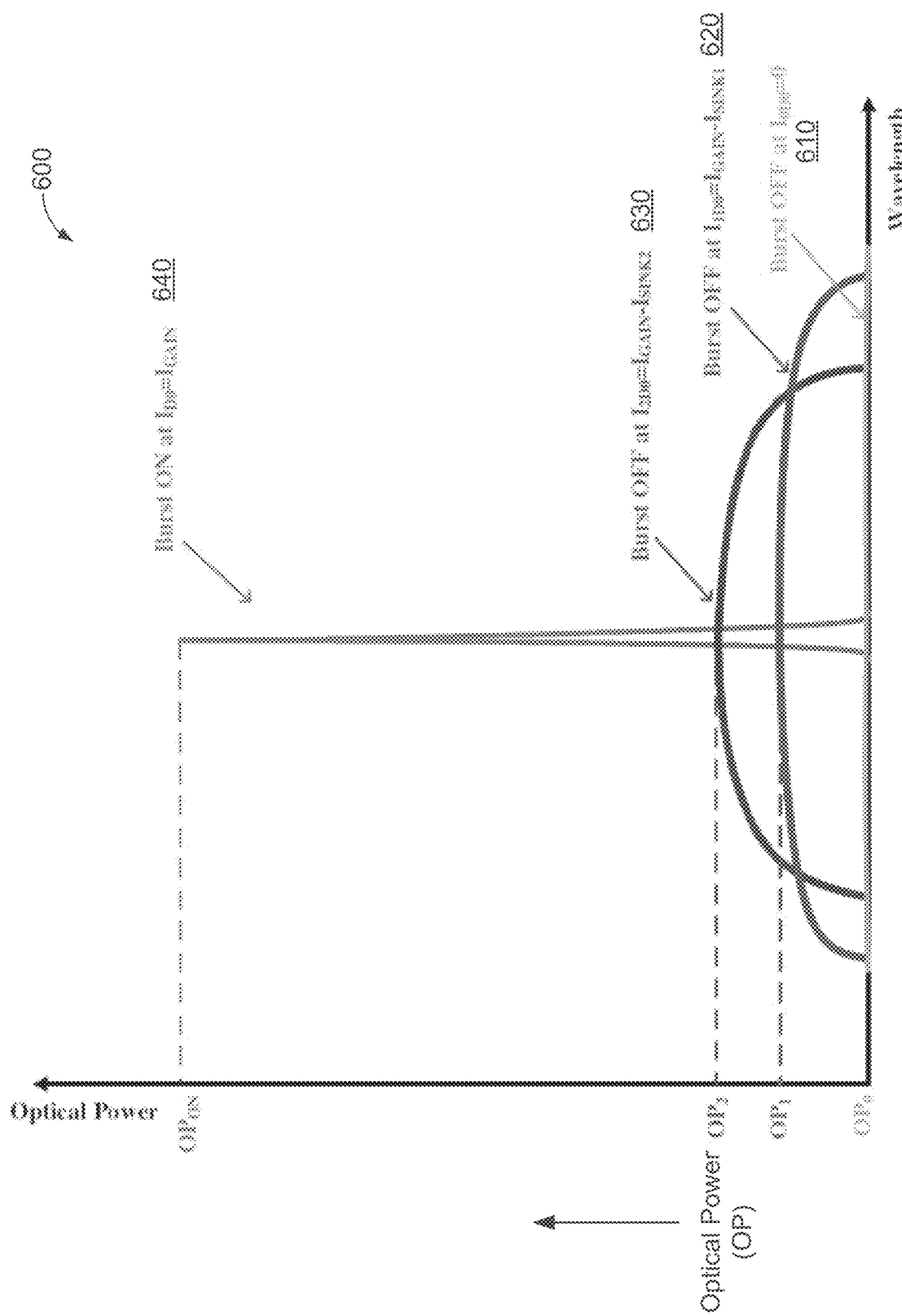
FIG. 6 illustrates a plot of optical power as a function of wavelength of a tunable laser driven by the laser driving circuit of FIG. 5.

In some configurations, the driving circuit 500 sinks away nearly all of the gain current $I_{GAIN}$ such that the optical power is negligible. Referring now to FIG. 6, profile line 610 depicts the optical power and wavelength of the laser 310 during the burst-off state when the diode current is fully diverted away ($I_{DO}=0$ and $I_{GAIN}=I_{SINK}$). The optical power is at state $OP_0$. Profile line 620 depicts the optical power and wavelength of the laser 310 when $I_{SINK}$ is less than $I_{GAIN}$ and $I_{DO}=I_{GAIN}-I_{SINK}$. In this configuration, the optical power is at state $OP_1$, which is greater than $OP_0$, but still well below the operating current (i.e. current threshold) for generating threshold optical power necessary to enable the laser 310, $OP_{ON}$. Profile line 630 depicts the optical power and wavelength of the laser 310 when $I_{SINK}$ is again less than $I_{GAIN}$ and $I_{DO}=I_{GAIN}-I_{SINK}$. In this configuration, the optical power is at state $OP_2$, which is greater than $OP_0$ and $OP_1$, but still below the threshold optical power necessary to enable the laser 310, $OP_{ON}$. Profile line 640 depicts the optical power and wavelength of the laser 310 during the burst-on state and when $I_{D0}=I_{GAIN}$ ($I_{SINK}=0$). At optical power states $OP_1$ and $OP_2$, the laser 310 works at spontaneous emission states well below the lasing power $OP_{ON}$.

Figure 7:
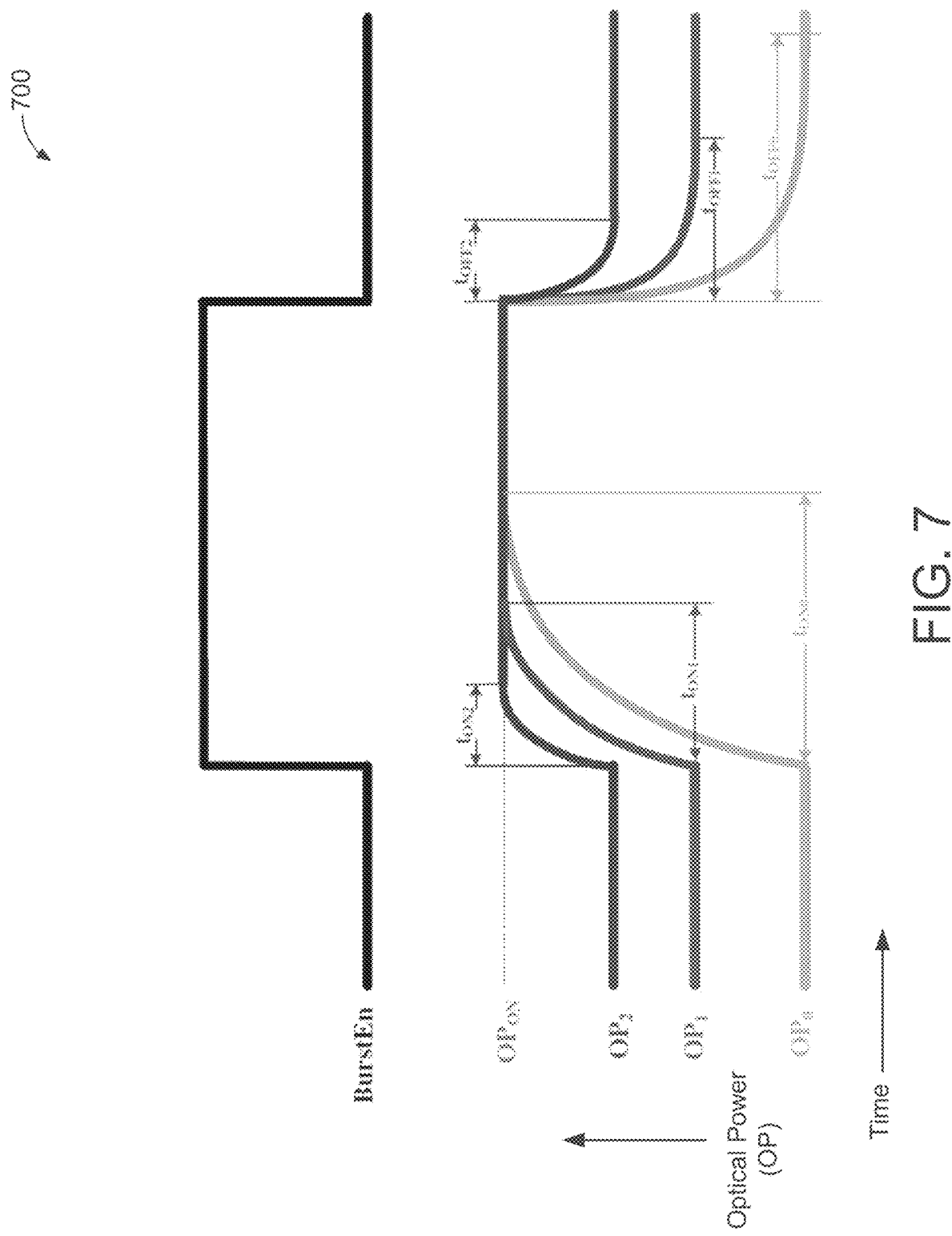
FIG. 7 illustrates a plot depicting burst-on state and burst-off state times based on optical power of a laser driven by the laser driving circuit of FIG. 5.

Referring now to FIG. 7, the EML burst time with optical power states $OP_0$, $OP_1$, $OP_2$, and $OP_{ON}$ are illustrated. As shown, as the optical power state increases, the burst-on and burst-off time decrease. In other words, sub-threshold currents in the laser 310 allow much faster burst-on and burst-off time as the laser anode stabilizing points are near to a threshold voltage. As such, FIG. 7 illustrates that a period of time for the laser 310 to turn on $t_{ON}$ and a period of time for the laser 310 to turn off $t_{OFF}$ both increase as the optical power OP is further from the threshold optical power necessary to transition the laser 310, from the burst-on and burst-off state (e.g., shown as $OP_{ON}$). Because of these increases in the period of time for the laser 310 to turn on $t_{ON}$ and turn off $t_{OFF}$, completely shutting down the tunable laser 310 introduces more wavelength drift to the tunable laser 310. Therefore, during burst-off when the driving circuit 500 sinks current away from the gain current $I_{GAIN}$, a sink current $I_{SINK}$ that reduces the gain section diode current $I_{D0}$ just below a current threshold to transition between the burst-on state and the burst-off state reduces wavelength drift and permits faster burst speeds.

Referring back to FIG. 5, the driving circuit 500 includes the overshoot stage 540 configured to shorten a burst time of the tunable laser 310 (e.g., EMLs 400, 400a-c). In some implementations, the overshoot stage 540 is capacitively coupled (e.g., by a fourth capacitor $C_4$) to the anode of the gain section diode $D_0$ to deliver an overshoot current $I_{OVER}$ to the anode of the gain section diode $D_0$. The overshoot stage 540 includes a Common-Source (CS) amplifier, a coupling capacitor $C_3$, and a MOS capacitor $M_6$. Here, the CS amplifier includes a fifth transistor $M_5$ and a fourth resistor $R_4$. In some implementations, the fifth transistor $M_5$ and the MOS capacitor $M_6$ may be n-type metal-oxide-semiconductors (NMOS) field-effect transistors (MOS-FETs). In other implementations, the transistors $M_5$, $M_6$ may be bipolar junction transistors (BJTs). In some examples, the MOS capacitor $M_6$ corresponds to the size of the fifth transistor $M_5$ with a source and a drain connected to ground to balance load parasitics for the burst stage 530 in order to avoid issues of performance degradation. In the configuration shown in FIG. 5, the CS amplifier in conjunction with the third capacitor $C_3$ and the fourth resistor $R_4$ has a transfer function represented by the following equations:

$$A(s) = A_0 \frac{\left(1 + \frac{s}{z_1}\right)}{\left(1 + \frac{s}{p_1}\right)} \quad (1)$$

where $$A_0 = \frac{g_{m5}}{g_{m5} + \frac{1}{R_4}} \quad (2)$$

$$z_1 = \frac{g_{m5}}{c_3} \quad (3)$$

$$p_1 = \frac{g_{m5} + \frac{1}{R_4}}{c_3} \quad (4)$$

Figure 8:
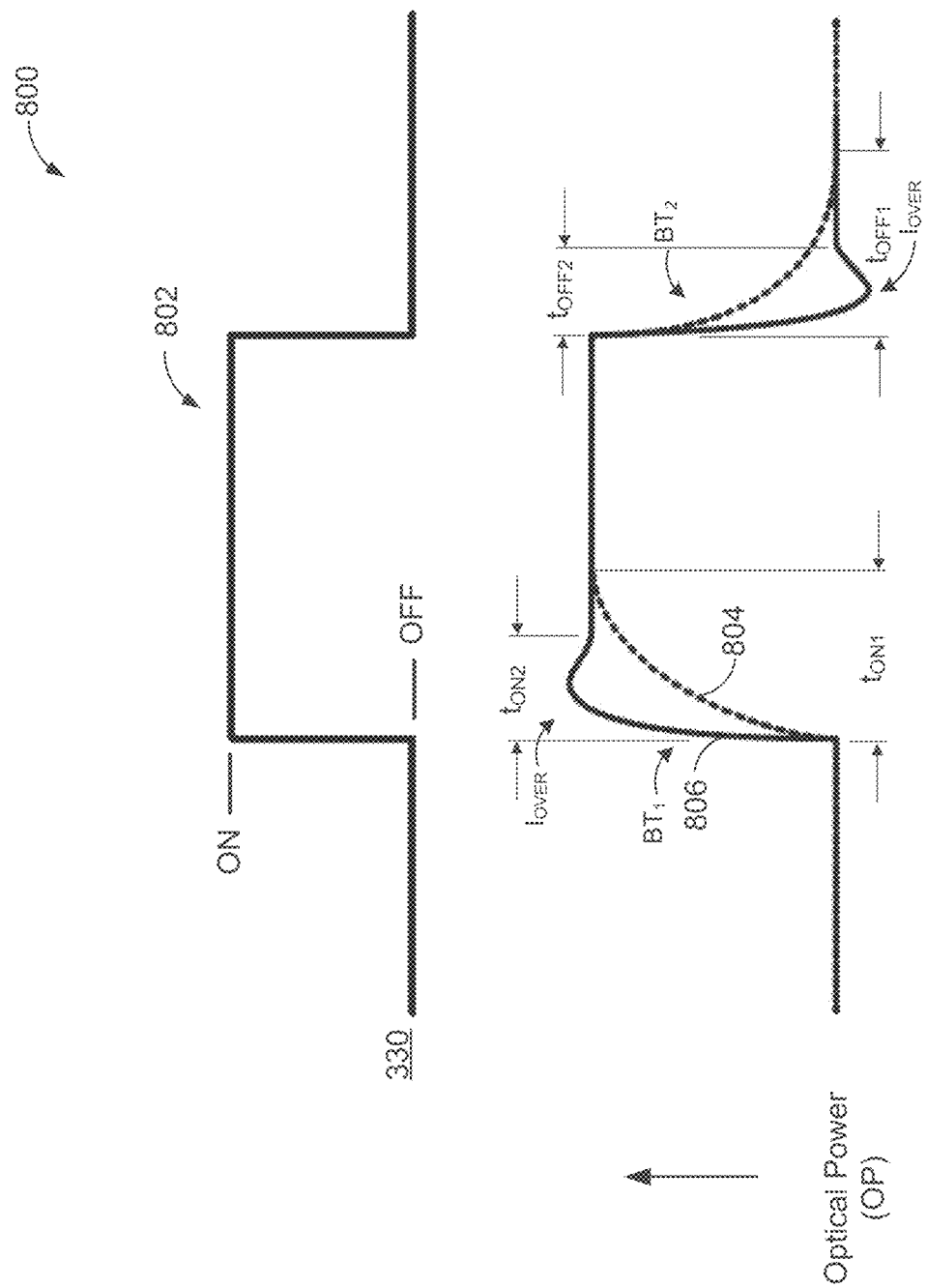
FIG. 8 illustrates a plot depicting burst-on state and burst-off state with and without an overshoot current applied by the laser driving circuit of FIG. 5.

Based on equations (1)-(4), the overshoot stage 540 is configured to further amplify the amplified burst signal 514, 514b by a gain of A(s) at a small-signal state around the operating point (e.g., shown as $BT_1$ and $BT_2$ in FIG. 8). For instance, a gain corresponding to the voltage source $V_{CC}$ 542 of the common-source amplifier amplifies the burst signal 514, 514b. Referring to the transfer function, $A_0$ is the DC gain of the overshoot stage 540. Moreover, as the zero $z_1$ (i.e. root of the input for the CS amplifier) is generated before the pole $p_1$ (i.e. root of the output for the CS amplifier), an overshoot current $I_{OVER}$ is injected into the driving circuit 500 at each burst transition (e.g., transitioning from the burst-on state to the burst-off state and vice-versa). In some examples, the driving circuit 500 provides the overshoot current $I_{OVER}$ for a transition period of time after commencement of the burst-on state. The transition period of time may be less than a burst-on period of time corresponding to a duration of the burst-on state.

FIG. 8 illustrates a plot 800 depicting burst-on state and burst-off state times based on optical power (OP) of the laser 310 with and without the overshoot current $I_{OVER}$ applied during burst transitions to the gain-section diode $D_0$. The plot 800 depicts the OP (y-axis) as a function of time (x-axis). Profile line 802 depicts the burst mode signal (BurstEn) 330 indicative of the burst-off-state (OFF) or the burst-off-state (ON). Profile line 804 depicts the OP setup process of the laser 310 during bursts when the overshoot stage 540 of the laser driving circuit 500 is not used (i.e. no overshoot current $I_{OVER}$ is added to the anode of the gain-section diode $D_0$). Profile line 806 depicts the OP of the laser 310 when the overshoot stage 540 of the laser driving circuit 500 delivers the overshoot current $I_{OVER}$ to the anode of the gain-section diode $D_0$ to shorten the time to transition between the burst-on state and the burst-off state.

Without delivery of the AC-coupled overshoot current $I_{OVER}$ of the laser driving circuit 500, the OP of the laser 310 depicted by profile line 804 takes a first burst-on time $t_{ON1}$ to increase to a threshold optical power during a burst mode transition from the burst-off state to the burst-on state. The stabilized OP corresponds to an optical power at the laser 310 suitable for transmitting the optical signal 104u from the ONU 140 to the OLT 120 at the transmit wavelength $\lambda_{Tx}$. During a burst mode transition back to the burst-off state from the burst-on state, the OP of the laser 310 takes a first burst-off time $t_{OFF1}$ to decrease from the threshold optical power.

When the overshoot stage 540 is capacitively coupled by the fourth capacitor $C_4$ to the anode of the gain-section diode $D_0$ to deliver the overshoot current $I_{OVER}$ to the gain-section diode $D_0$, the OP of the laser 310 depicted by profile line 806 takes a second burst-on time $t_{ON2}$ to increase to the stabilizing OP during the burst mode transition from the burst-off state to the burst-on state. In some examples, the overshoot stage 540 delivers the overshoot current $I_{OVER}$ to the anode of the gain-section diode $D_0$ for a transition period of time after commencement of the burst-on state. The transition period of time is less than a burst-on period of time corresponding to a duration of the burst-on state. In other words, the delivery of the overshoot current $I_{OVER}$ during the transition period occurs over a portion of the duration (i.e., at burst edges) of the burst-on state as, for example, indicated by the first burst transition point $BT_1$ and the second burst transition point $BT_2$. As the second burst-on time $t_{ON2}$ associated with the AC-coupled overshoot current $I_{OVER}$ is shorter than the first burst-on time $t_{ON1}$ without the overshoot stage 540, the transition time from burst-off state to the burst-on state is reduced (i.e. $t_{on2}<t_{on1}$). During a transition back to the burst-off state from the burst-on state, the OP of the laser 310 depicted by profile line 806 decreases from the threshold optical power in a second burn-off time $t_{OFF2}$ that is shorter than the first burn-off time $t_{OFF1}$ (i.e. $t_{off2}<t_{off1}$). As the second burn-off time $t_{OFF2}$ is shorter than the first burn-off time $t_{OFF1}$, the capacitive coupling of the overshoot stage 540 reduces the transition time from the burst-on state to the burst-off state. Additionally or alternatively, the overshoot stage 540 generates extra heat by the overshoot current which speeds up the temperature stabilizing process and shortens the burst times.

Figure 9:
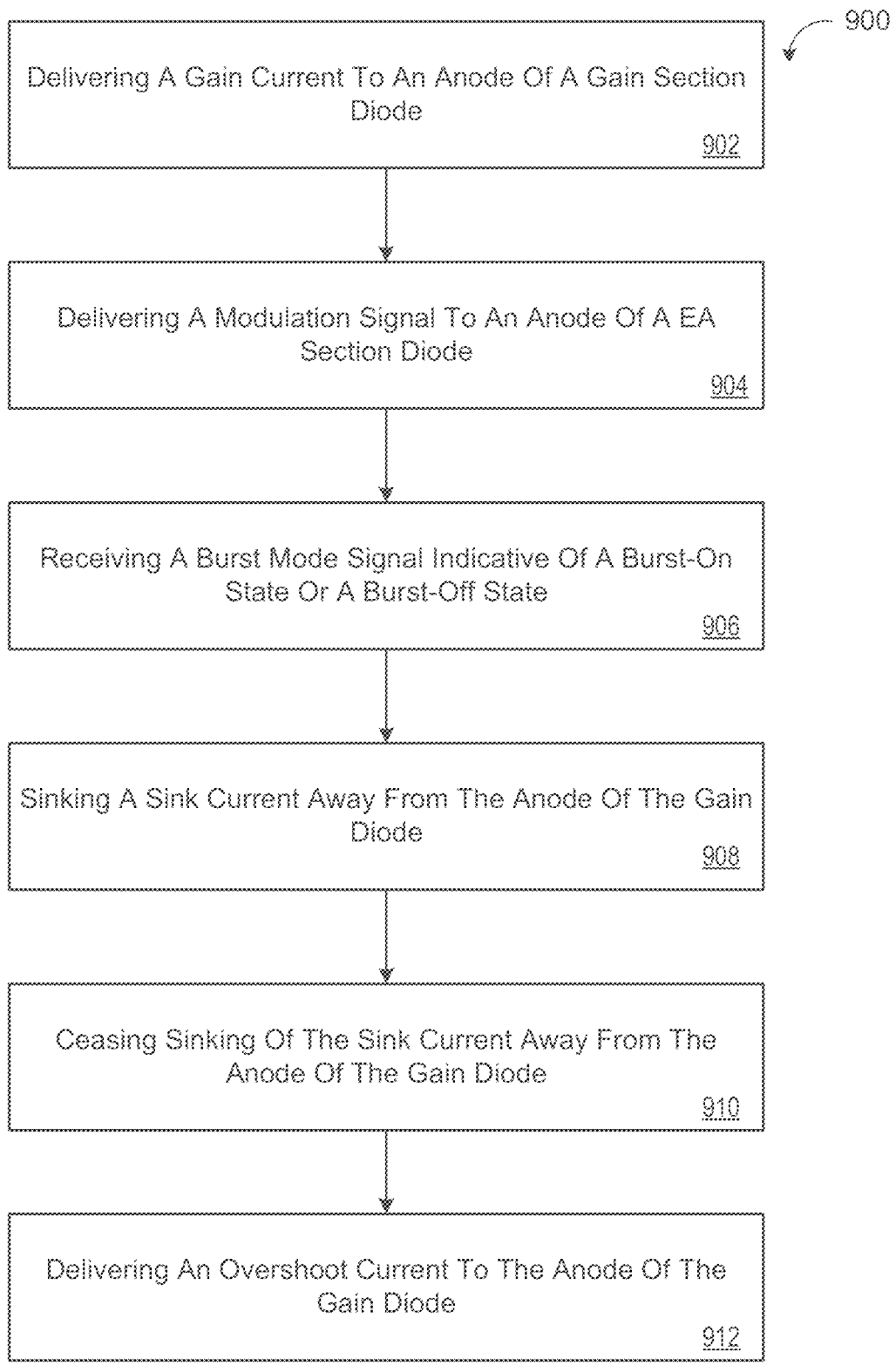
FIG. 9 is a schematic view of an example arrangement of operations for a method of driving a tunable laser during burst-on and burst-off states.

FIG. 9 is a flowchart of an example method 900 for biasing a tunable laser 310 during burst-on and burst-off states through a laser driving circuit 500. The flowchart starts at operation 902 when the laser driving circuit 500 delivers a gain current $I_{GAIN}$ to an node of a gain-section diode $D_0$ disposed on a shared substrate of a multi-section tunable laser 310. At operation 904, the method 900 includes delivering, by the laser driving circuit 500, a modulation signal to an anode of the EA section diode $D_2$. At operation 906, the method 900 includes receiving, at the laser driving circuit 500, a burst mode signal 330 indicative of the burst-on state or the burst-off state. At operation 908, when the burst mode signal 330 is indicative of the burst-off state, the method 900 includes sinking, by the laser driving circuit 500, a sink current $I_{SINK}$ away from the gain current $I_{GAIN}$ at the anode of the gain-section diode $D_0$. Here, the sink current $I_{SINK}$ is less than the gain current $I_{GAIN}$ delivered to the anode of the gain-section diode $D_0$. At operation 910, when the burst mode signal 330 transitions to be indicative of the burst-on state from the burst-off state, the method 900 includes ceasing, by the laser driving circuit 500, the sinking of the sink current $I_{SINK}$ away from the gain current $I_{GAIN}$ at the anode of the gain-section diode $D_0$. At operation 910, when the burst mode signal 330 transitions to be indicative of the burst-on state from the burst-off state, the method 900 includes delivering, by the laser driving circuit 500, an overshoot current $I_{OVER}$ to the anode of the gain section diode $D_0$.

Figure 10:
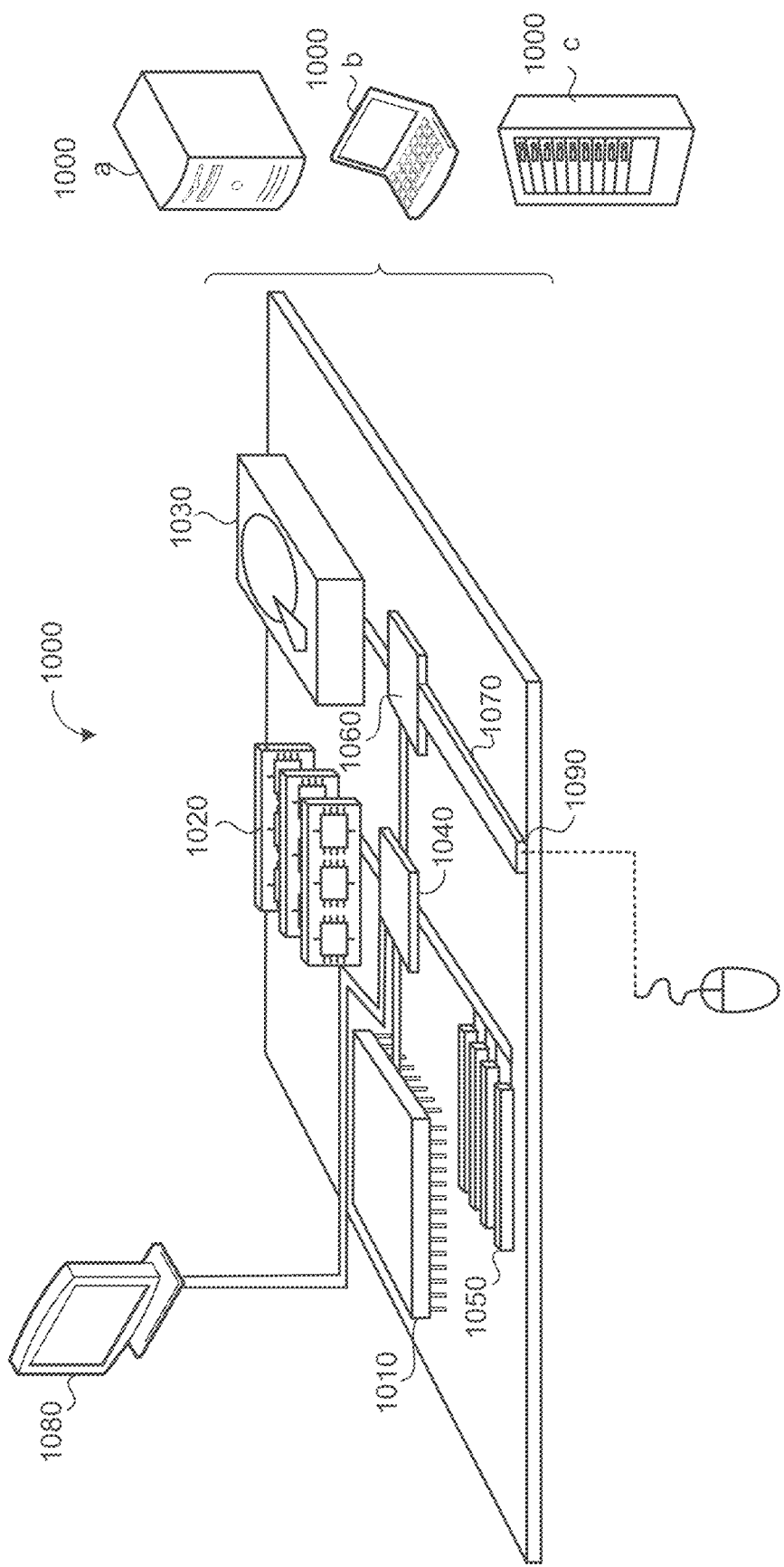
FIG. 10 is schematic view of an example computing device that may be used to implement the systems and methods described in this document.

FIG. 10 is a schematic view of an example computing device 1000 that may be used to implement and control the systems and methods described in this document, for example, to program the magnitudes of $I_{MOD}$, $I_{SINK}$, $V_{EA}$, or control the BurstEn, DAT+, DAT− signals etc. The computing device 1000 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 1000 includes a processor 1010, memory 1020, a storage device 1030, a high-speed interface/controller 1040 connecting to the memory 1020 and high-speed expansion ports 1080, and a low speed interface/controller 1060 connecting to low speed bus 1070 and storage device 1030. Each of the components 1010, 1020, 1030 ,1040, 1050, and 1060, are interconnected using various busses, and may be mounted on a common motherboard or in other manners as appropriate. The processor 1010 can process instructions for execution within the computing device 1000, including instructions stored in the memory 1020 or on the storage device 1030 to display graphical information for a graphical user interface (GUI) on an external input/output device, such as display 1080 coupled to high speed interface 1040. In other implementations, multiple processors and/or multiple buses may be used, as appropriate, along with multiple memories and types of memory. Also, multiple computing devices 1000 may be connected, with each device providing portions of the necessary operations (e.g., as a server bank, a group of blade servers, or a multi-processor system).

The memory 1020 stores information non-transitorily within the computing device 1000. The memory 1020 may be a computer-readable medium, a volatile memory unit(s), or non-volatile memory unit(s). The non-transitory memory 1020 may be physical devices used to store programs (e.g., sequences of instructions) or data (e.g., program state information) on a temporary or permanent basis for use by the computing device 1000. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 1030 is capable of providing mass storage for the computing device 1000. In some implementations, the storage device 1030 is a computer-readable medium. In various different implementations, the storage device 1030 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 1020, the storage device 1030, or memory on processor 1010.

The high speed controller 1040 manages bandwidth-intensive operations for the computing device 1000, while the low speed controller 1060 manages lower bandwidth-intensive operations. Such allocation of duties is exemplary only. In some implementations, the high-speed controller 1040 is coupled to the memory 1020, the display 1080 (e.g., through a graphics processor or accelerator), and to the high-speed expansion ports 1050, which may accept various expansion cards (not shown). In some implementations, the low-speed controller 1060 is coupled to the storage device 1030 and low-speed expansion port 1070. The low-speed expansion port 1070, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 1000 may be implemented in a number of different forms, as shown in the figure. For example, it may be implemented as a standard server 1000a or multiple times in a group of such servers 1000a, as a laptop computer 1000b, or as part of a rack server system 1000c.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

The processes and logic flows described in this specification can be performed by one or more programmable processors executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback, and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A method comprising:
    delivering, by a laser driving circuit, a gain current to an anode of a gain-section diode disposed on a shared substrate of a tunable laser;
    delivering, by the laser driving circuit, a modulation signal to an anode of an Electro-absorption (EA) section diode disposed on the shared substrate of the tunable laser;
    receiving, at the laser driving circuit, a burst mode signal indicative of a burst-on state or a burst-off state;
    when the burst mode signal is indicative of the burst-off state, sinking, by the laser driving circuit, a sink current away from the gain current at the anode of the gain-section diode, the sink current less than the gain current delivered to the anode of the gain-section diode; and
    when the burst mode signal transitions to be indicative of the burst-on state from the burst-off state:
        ceasing, by the laser driving circuit, the sinking of the sink current away from the gain current at the anode of the gain-section diode; and
        delivering, by the laser driving circuit, an overshoot current to the anode of the gain-section diode,
    wherein delivering the modulation signal comprises capacitively-coupling a modulation stage of the laser driving circuit to the anode of the EA section diode, the modulation stage comprises a differential pair of first and second metal-oxide-semiconductor field-effect transistors (MOSFETs) each connected to a data signal source, the first MOSFET connected to a first resistor and the second MOSFET connected by a capacitor to the anode of the EA section diode, the first resistor connected to a voltage source.

2. The method of claim 1, wherein, when the burst mode signal is indicative of the burst-off state, the gain-section diode comprises a gain-section diode current equal to the gain current minus the sink current, the gain-section diode current is greater than zero and less than an operating current for the tunable laser, the operating current corresponding to a current threshold to transition between the burst-on state and the burst-off state.

3. The method of claim 1, wherein the laser driving circuit comprises a high-speed transmission line between the gain-section diode and a current sink source.

4. The method of claim 1, wherein the laser driving circuit comprises a high-speed transmission line between the EA section diode and a current modulation source.

5. The method of claim 1, wherein the EA section diode is reversely biased by a programmable voltage source.

6. The method of claim 1, wherein the modulation signal associated with the EA section diode is separate from the burst mode signal associated with the gain-section diode.

7. The method of claim 1, further comprising receiving, at the laser driving circuit, a sink current adjustment from a burst stage of the laser driving circuit, the sink current adjustment configured to adjust the sink current.

8. The method of claim 7, wherein the burst stage comprises a differential pair of first and second MOSFETs, each MOSFET connected to a burst mode signal source, the first MOSFET connected to a resistor, the resistor connected to a voltage source, the second MOSFET connected to the anode of the gain-section diode.

9. The method of claim 8, wherein the first MOSFET is turned off and the second MOSFET is turned on to sink the sink current away from the anode of the gain-section diode when the burst mode signal is indicative of the burst-off state.

10. The method of claim 8, wherein the first MOSFET is turned ON and the second MOSFET is turned OFF to cease the sinking of the sink current away from the anode of the gain-section diode when the burst mode signal is indicative of the burst-on state.

11. The method of claim 1, further comprising delivering, by the laser driving circuit, the overshoot current to the anode of the gain-section diode for a transition period of time after commencement of the burst-on state, the transition period of time less than a burst-on period of time corresponding to a duration of the burst-on state.

12. The method of claim 1, wherein the laser driving circuit comprises an overshoot stage capacitively coupled to the anode of the gain-section diode to deliver the overshoot current to the anode of the gain-section diode, the overshoot stage comprising a common-source amplifier, the common-source amplifier comprising an n-type metal-oxide-semiconductor field-effect transistor (MOSFET) connected to a burst mode signal source and a first resistor.

13. The method of claim 1, wherein the second MOSFET is connected to a second resistor connected to a voltage supply.

14. The method of claim 1, wherein the tunable laser comprises a multi-section tunable laser.

15. A laser driving circuit comprising:
a voltage source configured to deliver a gain current to an anode of a gain-section diode disposed on a shared substrate of a tunable laser;
a modulation stage configured to deliver a modulation signal to an anode of an Electro-absorption (EA) section diode disposed on the shared substrate of the tunable laser, the modulation stage capacitively coupled to the anode of the EA section diode, the modulation stage comprising a differential pair of first and second metal-oxide-semiconductor field-effect transistors (MOSFETs) each connected to a data signal source, the first MOSFET connected to a first resistor and the second MOSFET connected by a capacitor to the anode of the EA section diode, the first resistor connected to the voltage source;
a burst stage configured to receive a burst mode signal indicative of a burst-on state or a burst-off state, the burst stage configured to:
when the burst mode signal is indicative of the burst-off state, sink a sink current away from the gain current at the anode of the gain-section diode, the sink current less than the gain current delivered to the anode of the gain-section diode; and
when the burst mode signal transitions to be indicative of the burst-on state from the burst-off state, ceasing the sinking of the sink current away from the gain current at the anode of the gain-section diode; and
an overshoot stage configured to deliver an overshoot current to the anode of the gain-section diode.

16. The laser driving circuit of claim 15, wherein, when the burst mode signal is indicative of the burst-off state, the gain-section diode comprises a gain-section diode current equal to the gain current minus the sink current, the gain-section diode current is greater than zero and less than an operating current for the tunable laser, the operating current corresponding to a current threshold to transition between the burst-on state and the burst-off state.

17. The laser driving circuit of claim 15, further comprising a high-speed transmission line between the gain-section diode and the burst stage.

18. The laser driving circuit of claim 15, further comprising a high-speed transmission line between the EA section diode and the modulation stage.

19. The laser driving circuit of claim 15, wherein the EA section diode is reversely biased by a programmable voltage source.

20. The laser driving circuit of claim 15, wherein the modulation signal associated with the EA section diode is separate from the burst mode signal associated with the gain-section diode.

21. The laser driving circuit of claim 15, wherein the burst stage is further configured to provide a sink current adjustment, the sink current adjustment configured to adjust the sink current.

22. The laser driving circuit of claim 15, wherein the burst stage comprises a differential pair of first and second MOSFETs, each MOSFET connected to a burst mode signal source, the first MOSFET connected to a resistor, the resistor connected to a voltage source, the second MOSFET connected to the anode of the gain-section diode.

23. The laser driving circuit of claim 22, wherein the first MOSFET is turned off and the second MOSFET is turned on to sink the sink current away from the anode of the gain-section diode when the burst mode signal is indicative of the burst-off state.

24. The laser driving circuit of claim 22, wherein the first MOSFET is turned ON and the second MOSFET is turned OFF to cease the sinking of the sink current away from the anode of the gain-section diode when the burst mode signal is indicative of the burst-on state.

25. The laser driving circuit of claim 15, wherein the overshoot stage delivers the overshoot current to the anode of the gain-section diode for a transition period of time after commencement of the burst-on state, the transition period of time less than a burst-on period of time corresponding to a duration of the burst-on state.

26. The laser driving circuit of claim 15, wherein the overshoot stage is capacitively coupled to the anode of the gain-section diode to deliver the overshoot current to the anode of the gain-section diode, the overshoot stage comprising a common-source amplifier, the common-source amplifier comprising an n-type metal-oxide-semiconductor field-effect transistor connected to a burst mode signal source and a first resistor.

27. The laser driving circuit of claim 15, wherein the second MOSFET is connected to a second resistor connected to a voltage supply.

28. The laser driving circuit of claim 15, wherein the tunable laser comprises a multi-section tunable laser.

* * * * *